United States Patent
Andrews et al.

(10) Patent No.: US 10,529,773 B2
(45) Date of Patent: Jan. 7, 2020

(54) SOLID STATE LIGHTING DEVICES WITH OPPOSING EMISSION DIRECTIONS

(71) Applicant: Cree, Inc., Durham, NC (US)

(72) Inventors: Peter Scott Andrews, Durham, NC (US); Christopher P. Hussell, Cary, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 15/896,805

(22) Filed: Feb. 14, 2018

(65) Prior Publication Data

US 2019/0252460 A1    Aug. 15, 2019

(51) Int. Cl.
| | |
|---|---|
| *H01L 27/15* | (2006.01) |
| *H01L 33/62* | (2010.01) |
| *H01L 33/60* | (2010.01) |
| *H01L 33/50* | (2010.01) |

(52) U.S. Cl.
CPC .......... *H01L 27/153* (2013.01); *H01L 33/50* (2013.01); *H01L 33/502* (2013.01); *H01L 33/507* (2013.01); *H01L 33/60* (2013.01); *H01L 33/62* (2013.01)

(58) Field of Classification Search
CPC ..... H01L 33/502; H01L 33/507; H01L 33/50; H01L 25/0753
See application file for complete search history.

(56) References Cited

U.S. PATENT DOCUMENTS

| | | | |
|---|---|---|---|
| 4,319,070 A | 3/1982 | Imai et al. | |
| 5,955,747 A | 9/1999 | Ogihara et al. | |
| 6,657,236 B1 | 12/2003 | Thibeault et al. | |
| 6,747,298 B2 | 6/2004 | Slater, Jr. et al. | |
| 6,791,119 B2 | 9/2004 | Slater, Jr. et al. | |
| 6,821,804 B2 | 11/2004 | Thibeault et al. | |
| 6,888,167 B2 | 5/2005 | Slater, Jr. et al. | |

(Continued)

FOREIGN PATENT DOCUMENTS

| | | |
|---|---|---|
| CN | 101894581 A | 11/2010 |
| EP | 2320483 A1 | 5/2011 |

(Continued)

OTHER PUBLICATIONS

U.S. Appl. No. 15/399,729, filed Jan. 5, 2017.

(Continued)

*Primary Examiner* — Ngan V Ngo

(74) *Attorney, Agent, or Firm* — Withrow & Terranova, P.L.L.C.; Vincent K. Gustafson

(57) ABSTRACT

Solid-state lighting devices, for example, light-emitting diodes (LEDs), which include a primary light-extraction face and a secondary light-extraction face that generally opposes the primary light-extraction face are disclosed. In some embodiments, mirrors internal to the LED may be omitted, and omnidirectional light from the active region is allowed to freely exit the primary light-extraction face and the secondary light-extraction face. In other embodiments, the first light-extraction face and second light-extraction face include opposing sidewalls of an LED. In such embodiments, mirrors internal to the LED may be utilized to direct omnidirectional light from the active region toward the first light-extraction face and the second light-extraction face.

10 Claims, 12 Drawing Sheets

(56) References Cited

U.S. PATENT DOCUMENTS

| | | | |
|---|---|---|---|
| 7,211,803 B1 | 5/2007 | Dhurjaty et al. | |
| 7,829,906 B2 | 11/2010 | Donofrio | |
| 8,716,724 B2 | 5/2014 | von Malm et al. | |
| 8,835,959 B2 | 9/2014 | Nakamura et al. | |
| 8,940,561 B2 | 1/2015 | Donofrio et al. | |
| 8,963,121 B2 | 2/2015 | Odnoblyudov et al. | |
| 8,969,897 B2 | 3/2015 | Choi | |
| 8,981,395 B2 | 3/2015 | Choi et al. | |
| 9,048,368 B2 | 6/2015 | Jeong | |
| 9,099,575 B2 | 8/2015 | Medendorp, Jr. et al. | |
| 9,123,864 B2 | 9/2015 | Tomonari et al. | |
| 9,129,977 B2 | 9/2015 | Marchand et al. | |
| 9,130,127 B2 | 9/2015 | Katsuno et al. | |
| 9,130,128 B2 | 9/2015 | Shinohara | |
| 9,130,137 B2 | 9/2015 | Lin et al. | |
| 9,136,432 B2 | 9/2015 | Yun et al. | |
| 9,136,433 B2 | 9/2015 | Park et al. | |
| 9,142,725 B1 | 9/2015 | Suzuki | |
| 9,153,750 B2 | 10/2015 | Seo et al. | |
| 9,159,894 B2 | 10/2015 | Cho et al. | |
| 9,166,107 B2 | 10/2015 | Park | |
| 9,166,108 B2 | 10/2015 | Unosawa | |
| 9,166,110 B2 | 10/2015 | Aihara | |
| 9,166,111 B2 | 10/2015 | Matsui et al. | |
| 9,171,882 B2 | 10/2015 | Akimoto et al. | |
| 9,172,002 B2 | 10/2015 | Wang et al. | |
| 9,172,021 B2 | 10/2015 | Sugizaki et al. | |
| 9,178,121 B2 | 11/2015 | Edmond et al. | |
| 9,196,653 B2 | 11/2015 | Leatherdale et al. | |
| 9,209,223 B2 | 12/2015 | Lee et al. | |
| 9,219,196 B2 | 12/2015 | Seo et al. | |
| 9,219,200 B2 | 12/2015 | Erchak et al. | |
| 9,231,037 B2 | 1/2016 | Shimayama | |
| 9,236,526 B2 | 1/2016 | Choi et al. | |
| 9,240,433 B2 | 1/2016 | Kim et al. | |
| 9,252,345 B2 | 2/2016 | Cho et al. | |
| 9,263,643 B2 | 2/2016 | Huang et al. | |
| 9,263,652 B2 | 2/2016 | Yoon et al. | |
| 9,269,858 B2 | 2/2016 | Schubert et al. | |
| 9,277,618 B2 | 3/2016 | Odnoblyudov et al. | |
| 9,281,448 B2 | 3/2016 | Choi et al. | |
| 9,281,449 B2 | 3/2016 | Kim et al. | |
| 9,287,457 B2 | 3/2016 | Jeong et al. | |
| 9,293,664 B2 | 3/2016 | Seo et al. | |
| 9,293,674 B2 | 3/2016 | Kususe et al. | |
| 9,293,675 B2 | 3/2016 | Yang et al. | |
| 9,299,889 B2 | 3/2016 | Katsuno et al. | |
| 9,299,893 B2 | 3/2016 | Chen et al. | |
| 9,300,111 B2 | 3/2016 | Lee et al. | |
| 9,318,529 B2 | 4/2016 | Jang et al. | |
| 9,324,765 B2 | 4/2016 | An | |
| 9,337,175 B2 | 5/2016 | Seo et al. | |
| 9,362,335 B2 | 6/2016 | von Malm | |
| 9,373,756 B2 | 6/2016 | Lee et al. | |
| 9,653,643 B2 | 5/2017 | Bergmann et al. | |
| 9,729,676 B2 | 8/2017 | Kobayashi et al. | |
| 9,754,926 B2 | 9/2017 | Donofrio et al. | |
| 9,831,220 B2 | 11/2017 | Donofrio et al. | |
| 10,317,787 B2 * | 6/2019 | Graves | G03B 21/56 |
| 2003/0015959 A1 | 1/2003 | Tomoda et al. | |
| 2005/0253492 A1 | 11/2005 | Besshi et al. | |
| 2008/0179611 A1 | 7/2008 | Chitnis et al. | |
| 2008/0211416 A1 | 9/2008 | Negley et al. | |
| 2008/0290351 A1 * | 11/2008 | Ajiki | H01L 25/0753 257/88 |
| 2009/0179843 A1 | 7/2009 | Ackermann et al. | |
| 2009/0241390 A1 | 10/2009 | Roberts | |
| 2010/0015574 A1 | 1/2010 | Van der Zel et al. | |
| 2010/0051785 A1 | 3/2010 | Dai et al. | |
| 2010/0123386 A1 | 5/2010 | Chen | |
| 2010/0163900 A1 | 7/2010 | Seo et al. | |
| 2011/0049545 A1 | 3/2011 | Basin et al. | |
| 2011/0084294 A1 | 4/2011 | Yao | |
| 2011/0121732 A1 * | 5/2011 | Tsutsumi | H01L 25/0753 315/77 |
| 2011/0294240 A1 | 12/2011 | Kim | |
| 2012/0119237 A1 | 5/2012 | Leatherdale et al. | |
| 2012/0205634 A1 | 8/2012 | Ikeda et al. | |
| 2012/0236582 A1 | 9/2012 | Waragaya et al. | |
| 2012/0268042 A1 * | 10/2012 | Shiobara | H01L 51/5275 315/312 |
| 2013/0264592 A1 * | 10/2013 | Bergmann | H01L 33/50 257/88 |
| 2014/0070245 A1 | 3/2014 | Haberern et al. | |
| 2014/0361321 A1 | 12/2014 | Saito et al. | |
| 2015/0207045 A1 | 7/2015 | Wada et al. | |
| 2015/0228876 A1 | 8/2015 | Place et al. | |
| 2015/0279902 A1 | 10/2015 | Von Malm et al. | |
| 2015/0311407 A1 | 10/2015 | Gootz et al. | |
| 2015/0340346 A1 | 11/2015 | Chu et al. | |
| 2016/0150614 A1 | 5/2016 | Randolph | |
| 2016/0163916 A1 | 6/2016 | Ilievski et al. | |
| 2016/0240516 A1 | 8/2016 | Chang | |
| 2017/0092820 A1 | 3/2017 | Kim et al. | |
| 2017/0098746 A1 | 4/2017 | Bergmann et al. | |
| 2017/0135177 A1 | 5/2017 | Wang et al. | |
| 2017/0141280 A1 * | 5/2017 | Zhong | H01L 33/62 |
| 2017/0207284 A1 | 7/2017 | Dykaar | |
| 2017/0250164 A1 * | 8/2017 | Takeya | H01L 25/0753 |
| 2017/0287887 A1 * | 10/2017 | Takeya | H01L 25/167 |
| 2017/0294417 A1 | 10/2017 | Edmond et al. | |
| 2017/0294418 A1 | 10/2017 | Edmond et al. | |
| 2017/0317251 A1 * | 11/2017 | Sweegers | H01L 33/46 |
| 2017/0318636 A1 | 11/2017 | Kums | |
| 2017/0358624 A1 * | 12/2017 | Takeya | H01L 27/156 |
| 2018/0012949 A1 * | 1/2018 | Takeya | H01L 27/15 |
| 2018/0212108 A1 | 7/2018 | Leirer et al. | |

FOREIGN PATENT DOCUMENTS

| | | |
|---|---|---|
| EP | 2325883 A2 | 5/2011 |
| EP | 2393132 A2 | 12/2011 |
| EP | 3076442 A1 | 10/2016 |
| JP | 5788046 B2 | 9/2015 |
| WO | 2008062783 A1 | 5/2008 |
| WO | 2015063077 A1 | 5/2015 |
| WO | 2016188505 A1 | 12/2016 |

OTHER PUBLICATIONS

U.S. Appl. No. 15/401,240, filed Jan. 9, 2017.
U.S. Appl. No. 15/499,520, filed Apr. 27, 2017.
U.S. Appl. No. 15/493,735, filed Apr. 21, 2017.
U.S. Appl. No. 15/621,731, filed Jun. 13, 2017.
Final Office Action for U.S. Appl. No. 15/399,729, dated Jun. 28, 2018, 9 pages.
Final Office Action for U.S. Appl. No. 15/401,240, dated Jun. 26, 2018, 11 pages.
Official Letter for Taiwanese Patent Application No. 106112033, dated Aug. 27, 2018, 19 pages.
Carey, Julian, "New LED architectures and phosphor technologies lower costs and boost quality (Magazine)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.
Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.
Dodel, DR. Kerstin et al., "Capital Markets Day 2015," Hella KGaA Hueck & Co, Dec. 2, 2015, London, HELLA, pp. 1-89.
Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.

(56) References Cited

OTHER PUBLICATIONS

Jiang, H.X. et al., "Nitride micro-LEDs and beyond—a decade progress review," Optics Express, vol. 21, Issue S3, Apr. 22, 2013, OSA, 10 pages.
Non-Final Office Action for U.S. Appl. No. 15/401,240, dated May 26, 2017, 7 pages.
Non-Final Office Action for U.S. Appl. No. 15/401,240, dated Jan. 17, 2018, 8 pages.
Invitation to Pay Additional Fees and Partial Search Report for International Patent Application No. PCT/US2017/026163, dated Aug. 1, 2017, 23 pages.
International Search Report and Written Opinion for International Patent Application No. PCT/US2017/026163, dated Oct. 25, 2017, 30 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/399,729, dated Jan. 24, 2018, 12 pages.
Notice of Allowance for U.S. Appl. No. 15/399,729, dated Oct. 23, 2018, 8 pages.
Notice of Allowance for U.S. Appl. No. 15/401,240, dated Oct. 25, 2018, 7 pages.
International Preliminary Report on Patentability for International Patent Application No. PCT/US2017/026163, dated Oct. 25, 2018, 20 pages.
Invitation to Pay Additional Fees and Partial Search Report for International Patent Application No. PCT/US2018/045102, dated Oct. 30, 2018, 14 pages.
International Search Report and Written Opinion for International Patent Application No. PCT/US2018/045102, dated Jan. 21, 2019, 23 pages.
Non-Final Office Action for U.S. Appl. No. 15/621,731, dated Dec. 31, 2018, 43 pages.
Non-Final Office Action for U.S. Appl. No. 15/399,729, dated Mar. 27, 2019, 9 pages.
Notice of Allowance for U.S. Appl. No. 15/401,240, dated Apr. 1, 2019, 8 pages.
Non-Final Office Action for U.S. Appl. No. 16/053,980, dated Jun. 13, 2019, 7 pages.
Examination Report for European Patent Application No. 17721889.8, dated Apr. 26, 2019, 12 pages.
Final Office Action for U.S. Appl. No. 15/621,731, dated Jul. 11, 2019, 15 pages.
Non-Final Office Action for U.S. Appl. No. 16/414,162, dated Sep. 13, 2019, 11 pages.
Advisory Action and AFCP 2.0 Decision for U.S. Appl. No. 15/621,731, dated Oct. 9, 2019, 4 pages.
Notice of Allowance for U.S. Appl. No. 16/053,980, dated Oct. 21, 2019, 9 pages.
Non-Final Office Action for U.S. Appl. No. 16/174,584, dated Oct. 21, 2019, 7 pages.

\* cited by examiner

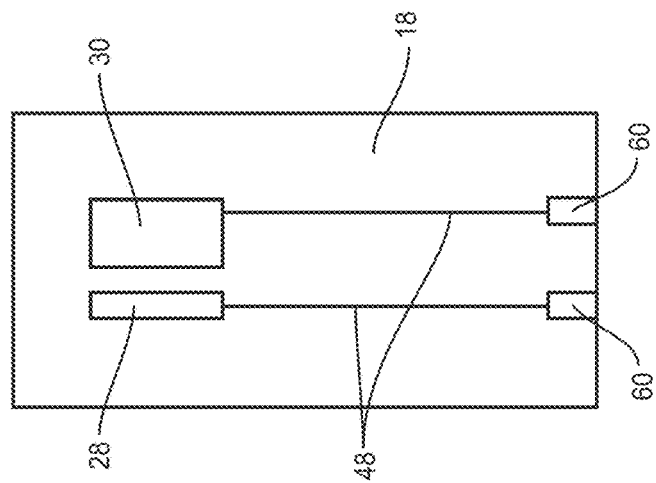
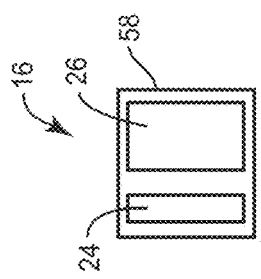
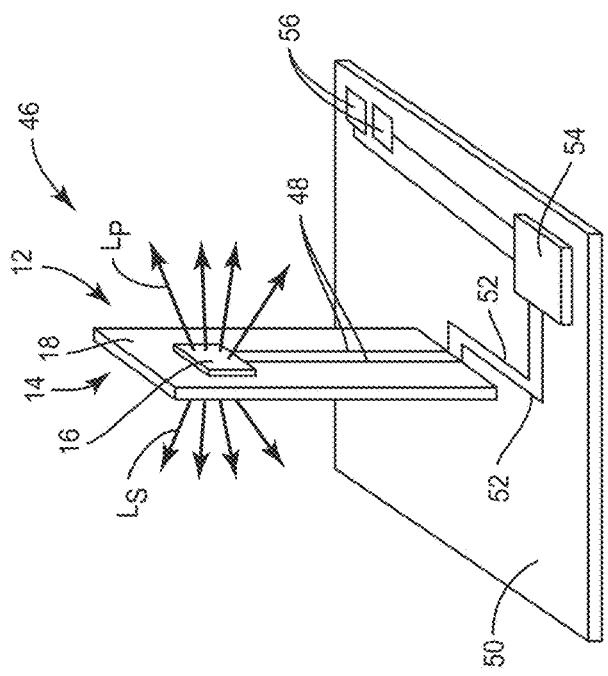

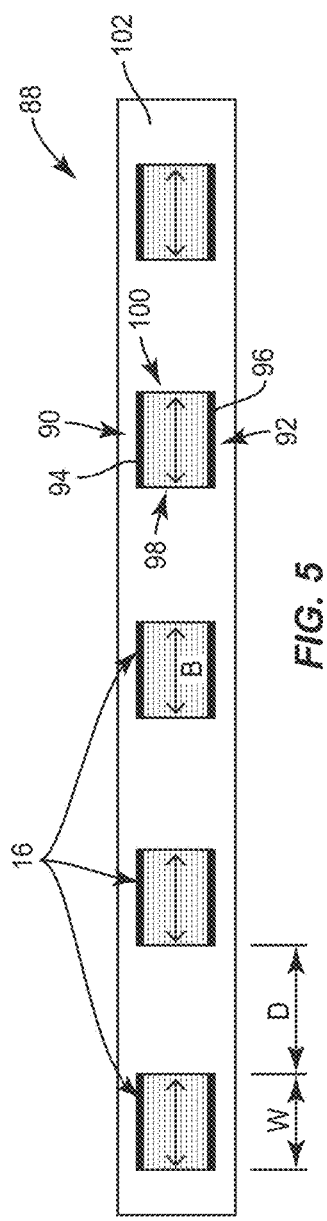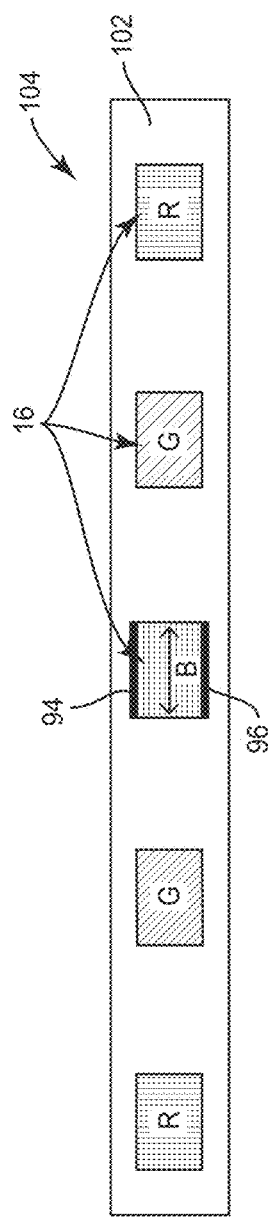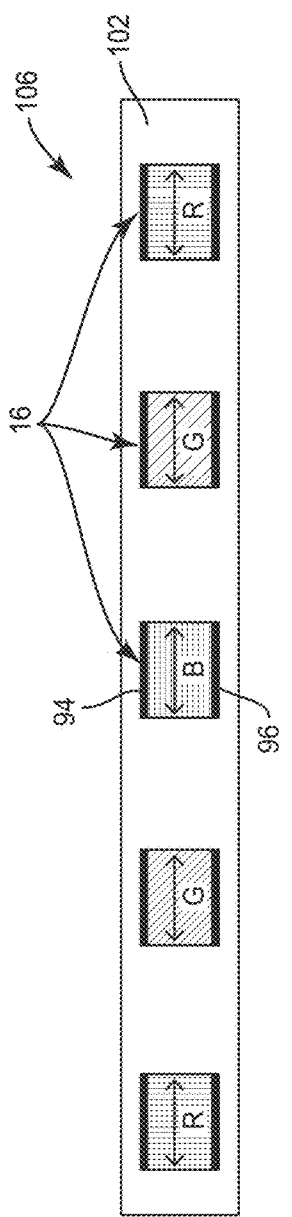

SOLID STATE LIGHTING DEVICES WITH OPPOSING EMISSION DIRECTIONS

TECHNICAL FIELD

The present disclosure relates to solid-state lighting devices such as light-emitting diodes, and more particularly to solid-state lighting devices configured to emit light in opposing directions.

BACKGROUND

Solid-state lighting devices such as light-emitting diodes (LEDs) are increasingly used in both consumer and commercial applications. Advancements in LED technology have resulted in highly efficient and mechanically robust light sources with long service life. Accordingly, modern LEDs have enabled a variety of new display applications and are being increasingly utilized for general illumination applications, often replacing incandescent and fluorescent light sources.

LEDs are solid-state devices that convert electrical energy to light, and they generally include one or more active layers of semiconductor material (forming at least one active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide based materials and/or from organic semiconductor materials. Photons generated by the active region are omnidirectional in character.

Typically, it is desirable to operate LEDs at the highest light emission efficiency possible, which can be measured by the emission intensity in relation to the output power (e.g., in lumens per watt) in a desired direction of light. Therefore, a practical goal to enhance emission efficiency is to redirect the omnidirectional light emitted by the active region toward the desired direction. One way to increase light extraction efficiency in a desired direction is to provide reflective surfaces that reflect generated light so that such light may contribute to useful emission from an LED chip. In certain instances, the reflective surface is internal to the LED chip and the LED chip is mounted on a submount such that the reflective surface is between the active region of the LED and the submount. Accordingly, light emitted from the active region or internally reflected toward the submount is reflected back toward a primary light exiting surface. However, some light may be absorbed due to reflectivity values of less than 100% for various reflective surfaces. Some metals can have less than 95% reflectivity in wavelength ranges of interest. Additional LED chips have been developed with internal mirrors or reflectors that include structures permitting electrical signals to be passed through such mirrors or reflectors. Such structures can include various combinations of conductive features (e.g., layers and/or vias) and insulating features (e.g., dielectric and/or passivation layers).

In certain instances, an LED chip may be mounted on a reflective submount to further redirect light toward a desired light direction. In other instances, the LED chip and submount may be arranged inside a fixture that includes additional reflective surfaces.

The art continues to seek improved light-emitting diodes and solid-state lighting devices having reduced optical losses and providing desirable illumination characteristics capable of overcoming challenges associated with conventional lighting devices.

SUMMARY

The present disclosure describes solid-state lighting devices, for example, light-emitting diodes (LEDs), which include a primary light-extraction face and a secondary light-extraction face that generally opposes the primary light-extraction face. In such embodiments, mirrors or reflectors internal to an LED (e.g., between a LED and submount, or otherwise arranged on or proximate to a mounting face of a LED) may be omitted, to allow omnidirectional light from the active region to freely exit the primary light-extraction face and the secondary light-extraction face. In other embodiments, the first light-extraction face and second light-extraction face include opposing sidewalls of an LED. In such embodiments, mirrors or reflectors internal to the LED may be utilized to direct omnidirectional light from the active region toward the first light-extraction face and the second light-extraction face.

In one aspect, a solid-state lighting device includes a primary light-extraction face and a secondary light-extraction face that generally opposes the primary light-extraction face; a plurality of LEDs supported by a light-transmissive submount; at least one light-segregation element positioned between different LEDs of the plurality of LEDs proximate to the primary light-extraction face; and at least one lumiphoric material arranged between different LEDs of the plurality of LEDs registered with the at least one light-segregation element, wherein the at least one lumiphoric material is arranged between the at least one light-segregation element and the secondary light-extraction face.

In certain embodiments, light emitted by the plurality of LEDs is extracted from both the primary light-extraction face and the secondary light-extraction face. In certain embodiments, the plurality of LEDs includes a plurality of discrete LED chips. In certain embodiments, the at least one light-segregation element includes a reflective material. In certain embodiments, the plurality of LEDs includes a plurality of active regions arranged on or over a monolithic substrate. In certain embodiments, the at least one light-segregation element includes an unfilled void. In certain embodiments, each LED of the plurality of LEDs is independently controllable.

In certain embodiments, the solid-state lighting device further includes a support element configured to support the light-transmissive submount. In certain embodiments, the support element is configured to be a display that outputs an image that is viewable from two opposing sides. In certain embodiments, the support element is configured to be a suspended lighting fixture that outputs light in two opposing directions.

In another aspect, a solid-state display device includes a plurality of LEDs supported by a light-transmissive submount, wherein each LED of the plurality of LEDs is individually controllable; a first image-forming face and a second image-forming face that generally opposes the first image-forming face, wherein the plurality of LEDs is arranged between the first image-forming face and the second image-forming face, and each of the first image-forming face and the second image-forming face is externally visible; and at least one light-segregation element positioned between different LEDs of the plurality of LEDs.

In certain embodiments, the plurality of LEDs includes a two-dimensional array of LEDs.

In another aspect, a solid-state lighting device includes a plurality of LED chips, wherein each LED chip of the plurality of LED chips includes an active region arranged between opposing first and second faces of the LED chip, and at least one LED chip of the plurality of LED chips includes a first mirror arranged on the first face and a second mirror arranged on the second face; and a continuous encapsulant material encapsulating the plurality of LED chips.

In certain embodiments, the first mirror and the second mirror each include a minimum threshold reflectivity of 95%. In certain embodiments, the continuous encapsulant material includes a light-affecting material. In certain embodiments, the light-affecting material includes at least one of a lumiphoric material and a light-scattering material. In certain embodiments, the plurality of LED chips includes at least one blue LED chip. In certain embodiments, the plurality of LED chips further includes at least one red LED chip and at least one green LED chip; and the at least one blue LED chip includes the first mirror and the second mirror. In certain embodiments, each LED chip of the plurality of LED chips includes a first mirror arranged on the first face and a second mirror arranged on the second face.

In certain embodiments, each LED chip of the plurality of LED chips is spaced apart from at least one other LED chip of the plurality of LED chips by a distance that is greater than a width of the individual LED chip.

In certain embodiments, light-affecting material is uniformly distributed within the continuous encapsulant material. In certain embodiments, the light-affecting material is non-uniformly distributed within the continuous encapsulant material, and a highest density of light-affecting material is arranged between LED chips of the plurality of LED chips.

In certain embodiments, the continuous encapsulant material includes at least one light-extraction element proximate to a light-extraction surface of the continuous encapsulant material. In certain embodiments, the light-extraction element includes a textured surface of the continuous encapsulant material.

In certain embodiments, the solid-state lighting device further includes a base including first and second electrical contacts; and an enclosure including at least one light-transmissive surface; wherein the plurality of LED chips is arranged within the enclosure and is arranged in electrical communication with the first and second electrical contacts.

In another aspect, a solid-state lighting device includes a light-reflective submount including a proximal face and a distal face; and at least one LED chip supported by the proximal face of the light-reflective submount, wherein the at least one LED chip includes an active region arranged between opposing first and second faces of the at least one LED chip, and a first mirror, wherein the active region is arranged between the first mirror and the light-reflective submount; wherein the at least one LED chip is devoid of a second mirror between the active region and the light-reflective submount. In certain embodiments, the distal face comprises a first light-reflective face. In certain embodiments, the solid-state lighting device further includes a lumiphoric material on the proximal face.

In certain embodiments, the at least one LED chip includes a plurality of LED chips. In certain embodiments, each LED chip of the plurality of LED chips is spaced apart from at least one other LED chip of the plurality of LED chips by a distance that is greater than a width of the individual LED chip. In certain embodiments, the proximal face includes a patterned or textured surface between each LED chip of the plurality of LED chips. In certain embodiments, the proximal face comprises a light-reflective face. In certain embodiments, the first mirror defines at least one opening, and the lumiphoric material is arranged within the at least one opening.

In another aspect, a solid-state lighting device includes a light-transmissive submount including a proximal face and a distal face; a first LED chip supported by the proximal face of the light-transmissive submount, wherein the first LED chip includes a first active region, and a first mirror, wherein the first active region is arranged between the first mirror and the light-transmissive submount; and a second LED chip supported by the distal face of the light-transmissive submount, wherein the second LED chip includes a second active region, and a second mirror, wherein the second active region is arranged between the second mirror and the light-transmissive submount. In certain embodiments, the solid-state lighting device further includes at least one lumiphoric material on the proximal face, and at least one lumiphoric material on the distal face.

In further aspects of the disclosure, it is specifically contemplated that any two or more aspects, embodiments, or features disclosed herein may be combined for additional advantage.

Those skilled in the art will appreciate the scope of the present disclosure and realize additional aspects thereof after reading the following detailed description of the preferred embodiments in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 2A is a perspective view of a solid-state lighting device according to one embodiment in which at least one LED is supported by a light-transmissive submount that is perpendicularly arranged relative to a support element having control circuitry for the at least one LED.

FIG. 2B is a rear elevation view of the at least one LED of FIG. 2A.

FIG. 2C is a front elevation view of the light-transmissive submount of FIG. 2A.

FIG. 5 is a cross-sectional view of a solid-state lighting device including multiple LED chips in an encapsulant material, with each LED chip having reflective materials arranged proximate to first and second faces thereof to direct light emissions laterally, according to one embodiment.

FIG. 6 is a cross-sectional view of a solid-state lighting device including multiple LED chips of various colors in an encapsulant material, with one LED chip having reflective materials arranged proximate to first and second faces thereof to direct light emissions laterally and with other LED chips being devoid of reflective materials, according to one embodiment.

FIG. 7 is a cross-sectional view of a solid-state lighting device including multiple LED chips of various colors in an encapsulant material, with each LED chip having reflective materials arranged proximate to first and second faces thereof to direct light emissions laterally, according to one embodiment.

DETAILED DESCRIPTION

Figure 1A:
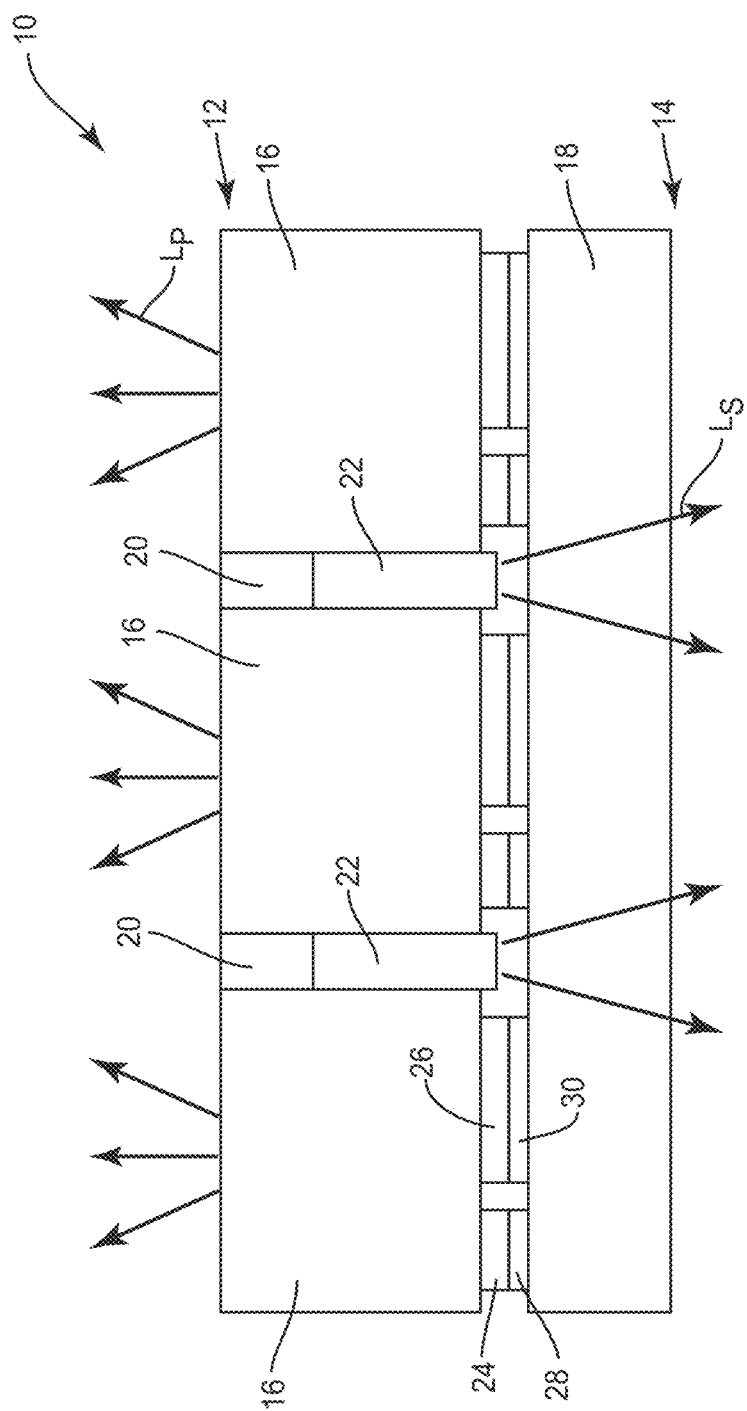
FIG. 1A is a cross-sectional view of a solid-state lighting device according to one embodiment including multiple LEDs supported by a light-transmissive submount with light segregation elements and at least one lumiphoric material arranged between different LEDs.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active region" of a solid-state light-emitting device refers to the region in which majority and minority electronic carriers (e.g., holes and electrons) recombine to produce light. In general, an active region according to embodiments disclosed herein can include a well structure, such as a quantum well structure or a multi-quantum well structure.

Solid-state light-emitting devices disclosed herein may include at least one solid-state light source (e.g., a light-emitting diode, or LED) and one or more lumiphoric materials (also referred to herein as lumiphors) arranged to receive emissions of the at least one solid-state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicon or glass, arranged in the form of a single crystalline plate or layer, arranged in the form of a polycrystalline plate or layer, and/or arranged in the form of a sintered plate. In certain embodiments, a lumiphoric material such as a phosphor may be spin coated or sprayed on a surface of an LED array. In certain embodiments, a lumiphoric material may be located on a growth substrate, on epitaxial layers, and/or on a carrier substrate of an LED array. Multiple pixels including one or more lumiphoric materials may be manufactured in a single plate. In general, a solid-state light source may generate light having a first dominant wavelength. At least one lumiphor receiving at least a portion of the light generated by the solid-state light source may re-emit light having a second dominant wavelength that is different from the first dominant wavelength. A solid-state light source and one or more lumiphoric materials may be selected such that their combined output results in light with one or more desired characteristics such as color, color point, and intensity. In certain embodiments, aggregate emissions of one or more LEDs, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red dominant wavelengths may be used. In certain embodiments, lumiphoric materials may be added to one or more emitting surfaces by methods such as spray coating, dipping, liquid dispensation, powder coating, inkjet printing, or the like. In certain embodiments, lumiphoric material may be dispersed in an encapsulant, adhesive, or other binding medium.

As used herein, a layer or region of a light-emitting device may be considered to be "transparent" when at least 90% of emitted radiation that impinges on the transparent layer or region emerges through the transparent region. Moreover, as used herein, a layer or region of an LED is considered to be "reflective" or embody a "mirror" or a "reflector" when at least 90% of the angle averaged emitted radiation that impinges on the layer or region is reflected. For example, in the context of gallium nitride-based blue and/or green LEDs, silver (for example, at least 90% reflective) may be considered a reflective material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein may utilize flip chip LED devices in which a light-transmissive substrate represents an exposed light-emitting surface. In certain embodiments, the light-transmissive substrate embodies or includes an LED growth substrate, wherein multiple LEDs are grown on the same substrate that forms a light-emitting surface or region. In certain embodiments, a monolithic multi-LED chip includes LEDs that are all grown on the same growth substrate, with the LEDs also sharing the same n-GaN layer and/or other functional layers. In certain embodiments, one or more portions (or the entirety) of a growth substrate and/or portions of epitaxial layers may be thinned or removed. In certain embodiments, a second substrate (also known as a carrier) may be added to a multi-LED chip, whether or not a growth substrate has been partially or fully removed. In certain embodiments, a light-transmissive substrate includes silicon carbide (SiC), sapphire, or glass. Multiple LEDs (e.g., flip chip LEDs) may be grown on a substrate and incorporated into a light-emitting device. In certain embodiments, a substrate (e.g., silicon) may include vias arranged to make contact with LED chips mounted or grown thereon. In certain embodiments, individual LEDs or LED packages may be individually placed and mounted on or over a substrate to form an array. For example, multiple LED chips or multiple wafer-level packaged LEDs may be used to form LED arrays or subarrays.

Although conventional flip chip LEDs typically incorporate at least one mirror near a mounting face of the LED to redirect light toward a primary emission direction, in certain embodiments such a mirror may be omitted. A flip chip LED includes anode and cathode contacts that are spaced apart and extend along the mounting face, with such face opposing a face defined by the light-transmissive (preferably transparent) substrate. A flip chip LED may be termed a horizontal structure, as opposed to a vertical structure having contacts on opposing faces of a LED chip. In certain embodiments, the transparent substrate may be patterned, roughened, or otherwise textured to provide a varying internal or external surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

Patterning or texturing of a substrate may depend on the substrate material and the implications on light-extraction efficiency and/or pixel separation. If a silicon carbide substrate is used, then the index of refraction of the silicon carbide is well matched to a gallium nitride-based active region of a LED, so light emissions of the active region tend to enter the substrate easily. If a sapphire substrate is used, then it may be desirable to provide a patterned, roughened, or textured interface between the active region and the substrate to promote passage of LED emissions into the substrate. With respect to a light-extraction surface of a substrate, in certain embodiments it may be desirable to provide a patterned, roughened, or textured surface to promote extraction of light from the substrate.

In certain embodiments, LEDs may be grown on a first substrate of a first material (e.g., silicon, silicon carbide, or sapphire), the first (growth) substrate may be partially removed (e.g., thinned) or fully removed, and the LEDs may be bonded to, mounted to, or otherwise supported by a second substrate of a second material (e.g., glass or sapphire) through which LED emissions are transmitted, wherein the second material is preferably more transmissive of LED emissions than the first material. The first (growth) substrate may be removed before or after the LEDs are bonded to, mounted to, or otherwise supported by the second substrate. Removal of the first (growth) substrate may be done by any appropriate method, such as use of an internal parting region or parting layer that is weakened and/or separated by application of energy (e.g., laser rastering, sonic waves, or heat), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs to a substrate, or bonding of substrates to a carrier, may be performed by any suitable methods. Any suitable wafer-bonding technique known in the art may be used, such as may rely on van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion-promoting materials may additionally or alternatively be used.

In certain embodiments, an LED array is monolithic and includes multiple LEDs grown on a single first (or growth) substrate, with the growth substrate removed from the LEDs, and a second substrate (or carrier) added to the LEDs before or after removal of the first (growth) substrate, with the second substrate including one or more reflective layers, vias, and a phosphor layer (e.g., spin-coated phosphor layer). In certain embodiments, a LED array is monolithic and includes multiple LEDs grown on a single growth substrate, wherein grooves, recesses, or other features are defined in the growth substrate and/or a carrier and are used to form light-affecting elements, optionally being filled with one or more materials such as to form a grid between individual LEDs or pixels.

In certain embodiments utilizing flip chip LEDs (e.g., embodied in a multi-LED array), a light-transmissive substrate, a plurality of semiconductor layers, and passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light-emitting active region is arranged between the first semiconductor layer and the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate usable for forming and supporting an array of flip chip LEDs may include sapphire; alternatively, the substrate may include silicon, silicon carbide, a Group III-nitride material (e.g., GaN), or any combination of the foregoing materials (e.g., silicon on sapphire). Further details regarding fabrication of flip chip LEDs are disclosed in U.S. Patent Publication No. 2017/0098746 A1, with the entire contents thereof being hereby incorporated by reference herein.

Light emitted by the active region of an LED is typically omnidirectional in character. For directional applications, internal mirrors or external reflective surfaces may be employed to redirect as much light as possible toward a desired direction. Mirrors and reflective surfaces may include single or multiple layers. Some multi-layer mirrors include a metal reflector layer and a dielectric reflector layer, wherein the dielectric reflector layer is arranged between the metal reflector layer and the plurality of semiconductor layers. A passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. For single or multi-layer mirrors including surfaces exhibiting less than 100% reflectivity, some light may be absorbed by the mirror. Additionally, light that is redirected from the reflector surface travels back through the LED structure and may be absorbed by other layers or elements within the LED.

Some embodiments described herein include solid-state lighting devices, for example, LEDs, which include a primary light-extraction face and a secondary light-extraction face that generally opposes the primary light-extraction face. In such embodiments, mirrors internal to the LED may be omitted, and omnidirectional light from the active region is allowed to freely exit the primary light-extraction face and the secondary light-extraction face.

In certain embodiments, multiple LEDs may be supported by a light-transmissive submount with light segregation elements arranged between different LEDs proximate to a first or primary light extraction face, and at least one lumiphoric material arranged between different LEDs proximate to a second or secondary light extraction face. Provision of light segregation elements between different LEDs may increase perceived contrast between LEDs when the first light extraction face is viewed (as may be desirable for LED display applications), while provision of lumiphoric material between different LEDs may enhance overall light emission and/or provide ambient lighting provided by the second light extraction face.

FIG. 1A is a cross-sectional view of a solid-state lighting device 10 that includes a primary light-extraction face 12 and a secondary light-extraction face 14 that generally opposes the primary light-extraction face 12. A plurality of LEDs 16 are supported by a light-transmissive submount 18. The light-transmissive submount 18 may include any number of light transmissive materials, including but not limited to glass, sapphire, silicon carbide, polymers, dielectrics, and combinations thereof. The light-transmissive submount 18 may be rigid in some embodiments and flexible in other embodiments. At least one light-segregation element 20 is positioned between different LEDs of the plurality of LEDs 16 proximate to the primary light-extraction face 12. At least one lumiphoric material 22 is arranged between different LEDs of the plurality of LEDs 16 and is registered with the at least one light-segregation element 20 such that the at least one lumiphoric material 22 is arranged between the at least one light-segregation element 20 and the secondary light-extraction face 14. As shown, a central portion of the at least one light-segregation element 20 is generally closer to the primary light-extraction face 12, and a central portion of the at least lumiphoric material 22 is generally closer to first and second contacts 24, 26 of each LED of the plurality of LEDs 16. Light emitting from the plurality of LEDs 16 is extracted from both the primary light-extraction face 12 and the secondary light-extraction face 14. In FIG. 1A, light $L_P$ exits from the primary light-extraction face 12 and light $L_S$ exits from the secondary light-extraction face 14. In some embodiments, the plurality of LEDs 16 includes a plurality of discrete (separate) LED chips. The plurality of discrete LED chips may be fabricated separately and then individually mounted to the light-transmissive submount 18 or the plurality of discrete LED chips may be fabricated together on a common growth substrate that is removed after the LEDs are mounted or bonded to the light-transmissive submount 18.

As illustrated in FIG. 1A, the plurality of LEDs 16 is arranged in a flip chip configuration such that a first contact 24 and a second contact 26 of each LED of the plurality of LEDs 16 is positioned adjacent to the light-transmissive submount 18. In some embodiments, the first contact 24 may correspond to an anode and the second contact 26 may correspond to a cathode of each LED of the plurality of LEDs 16. In other embodiments, the order may be reversed such that the first contact 24 may correspond to a cathode and the second contact 26 may correspond to an anode of each LED of the plurality of LEDs 16. The first contact 24 and the second contact 26 may be configured to be light transmissive. For example, the material and thickness of the first contact 24 and the second contact 26 may be selected to allow passage of at least some light emitted by the LED. In other embodiments, the first contact 24 and the second contact 26 may be configured to occupy an area as small as possible which still maintains the electrical connection. Accordingly, more light is able to pass between the first contact 24 and the second contact 26 of each LED of the plurality of LEDs 16. The light-transmissive submount 18 includes a corresponding first mounting pad 28 and a second mounting pad 30 for making electrical contact with the first contact 24 and the second contact 26, respectively, of each LED of the plurality of LEDs 16. The first mounting pad 28 and the second mounting pad 30 for each LED of the plurality of LEDs 16 are shown isolated from each other in FIG. 1A, such that each LED of the plurality of LEDs may be independently controlled. In other embodiments, additional electrical connections may be provided on the light-transmissive submount 18 in order to connect the plurality of LEDs 16 in series, in parallel, or in combinations (e.g., series-parallel combination) thereof. While FIG. 1A illustrates flip chip LEDs, it is understood that such LEDs of other configurations could be used, such as vertical LEDs in which the anodes and cathodes are on opposing sides, or lateral LEDs in which the anodes and cathodes are on the top-side of the LEDs. Additionally, LEDs may be multiple-junction monolithic LEDs in which multiple discrete LED junctions are connected in series or parallel configurations within each the LED.

As noted previously, the omnidirectional character of LED emissions may render it difficult to prevent emissions of one LED (e.g., a first pixel) from significantly overlapping emissions of another LED (e.g., a second pixel) of an array of LEDs in which individual LEDs are arranged close to one another. Light traveling in numerous directions leads to light scattering and loss of pixel-like resolution of emissions. Problems of light scattering and loss of pixel-like resolution may be further exacerbated by presence of one or more lumiphoric materials overlying the primary light-extraction face, owing to the omnidirectional character of lumiphor emissions. Various embodiments disclosed herein address this issue by providing light-segregation elements configured to reduce interaction between emissions of different LEDs and/or lumiphoric material regions, thereby reducing scattering and/or optical crosstalk and preserving pixel-like resolution of the resulting emissions. In certain embodiments, light-segregation elements may extend inward (into an interior of a solid-state lighting device) from a primary light-extraction face between LEDs, may extend outward from the primary light-extraction face, or any combination of the foregoing. In certain embodiments, multiple light-segregation elements may be defined by different methods in the solid-state lighting device. In certain embodiments, light-segregation elements of different sizes and/or shapes may be provided in the same solid-state lighting device. For example, in certain embodiments, a first group of light-segregation elements characterized by a first size, shape, and/or fabrication technique may extend from the primary light-extraction face into an interior of the solid-state lighting device, and a second group of light-segregation elements characterized by a second size, shape, and/or fabrication technique may extend from the primary light-extraction face into an interior of the solid-state lighting device, wherein one or more of the second size, shape, and/or fabrication technique differs from the first size, shape, and/or fabrication technique. In certain embodiments, light-segregation elements may include recesses (whether filled or unfilled) defined in the solid-state lighting device supporting multiple LEDs, with such recesses embodying boundaries between pixels.

Turning back to FIG. 1A, each light-segregation element 20 is positioned between different LEDs of the plurality of LEDs 16 proximate to the primary light-extraction face 12. In some embodiments, each light-segregation element 20 includes a light-reflective material, a light-absorptive material, an unfilled void, a recess, or combinations thereof. One example of a light-reflective material that may be used is titanium dioxide [$TiO_2$], optionally provided in a powdered form and contained in a binder such as silicone. Other metals or metal-containing materials may be used as light-reflective materials. One example of a light-absorptive material that may be used is carbon black, optionally provided in a powdered form and contained in a binder such as silicone. Other light-reflective materials, light-absorptive materials, and/or binders may be used As previously described, the at least one lumiphoric material 22 may be arranged between different LEDs of the plurality of LEDs 16 and is registered with the at least one light-segregation element 20, such that the at least one lumiphoric material 22 is arranged between the at least one light-segregation element 20 and the secondary light-extraction face 14. Accordingly, light $L_P$ exiting the solid-state lighting device 10 from the primary light-extraction face 12 remains pixelated while light $L_S$ exiting the solid-state lighting device 10 from the secondary light-extraction face 14 is more uniform due to the scattering and the light-converting nature of the lumiphoric material 22. This may be useful in applications in which it is desirable to view a display from the primary light-extraction face 12 while the secondary light-extraction face 14 provides ambient lighting to the background. In some embodiments, the plurality of LEDs 16 may have a peak emissive wavelength light of any suitable color, such as but not limited to blue, green, or red. For example, a blue LED may include a peak wavelength in a range of 430 nm to 480 nm, a green LED may include a peak wavelength in a range of 500 nm to 570 nm, and a red LED may include a peak wavelength in a range of 600 nm to 650 nm. In some instances, a blue LED may have a radiant flux higher than red LEDs or green LEDs and therefore may provide an excess of blue wavelengths in systems where LEDs of all three colors are present. In that regard, the plurality of LEDs 16 may comprise at least one blue LED, at least one green LED and at least one red LED. The red and green LEDs may be configured with standard reflectors or mirrors to direct their respective light to the primary light-extraction face 12 and light from the blue LED is allowed to exit both the primary light-extraction face 12 and the secondary light-extraction face 14. In some embodiments, the at least one light-segregation element 20 may be positioned between each of the plurality of LEDs 16 proximate to the primary light-extraction face 12 and the at least one lumiphoric material 22 may only be registered with the at least one light-segregation element 20 adjacent the blue LED. This may be useful in applications where the primary light-extraction face 12 is a controllable display while the secondary light-extraction face 14 is backlit with excess blue light or a combination of excess blue light and emissions from the at least one lumiphoric material 22. In other embodiments, additional lumiphoric material may be provided on the primary light-extraction face 12 (optionally supplemented by reduction or elimination of light-segregation material 20 provided between LEDs 12) and accordingly light $L_P$ exiting the primary light-extraction face 12 may also be more uniform. Such embodiments may be particularly useful for general illumination applications in which uniform light is desired in primary and secondary directions.

Figure 1B:
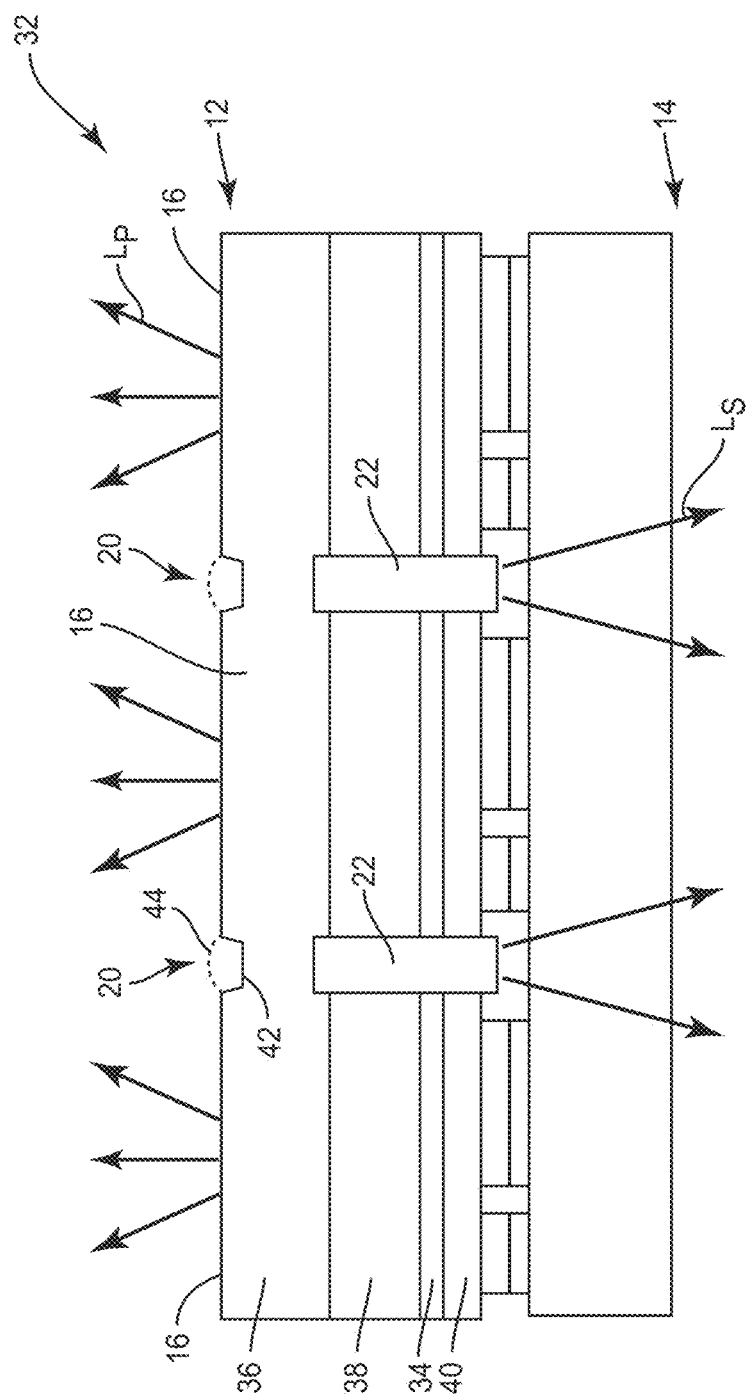
FIG. 1B is a cross-sectional view of a solid-state lighting device similar to the lighting device of FIG. 1A, having smaller light-segregation elements registered with the one or more lumiphoric materials arranged between different LEDs.

FIG. 1B is a cross-sectional view of a solid-state light device 32 according to some embodiments where the plurality of LEDs 16 includes a plurality of active regions 34 arranged on or over a monolithic substrate 36. In some embodiments, the monolithic substrate 36 is a growth substrate where one or more n-type layers 38, the active region 34, and one or more p-type layers 40 are formed sequentially by epitaxial growth. The active regions 34 are isolated from each other on the monolithic substrate 36. In other embodiments, the monolithic substrate 36 is a substrate to which the active regions 34 have been mounted or bonded. As illustrated in FIG. 1B, at least a portion of the monolithic substrate 36 is continuous between the plurality of LEDs 16. The one or more n-type layers 38 are illustrated as discontinuous; however, in some embodiments, at least a portion of the one or more n-type layers 38 may also be continuous between the plurality of LEDs 16. In FIG. 1B, each of the at least one light-segregation element 20 between the plurality of LEDs 16 may include a recess 42, a protrusion 44, or combinations thereof. In embodiments in which each of the at least one light-segregation element 20 includes the recess 42, the recess 42 may be filled with a light-reflecting material or a light-absorbing material, or the recess 42 may be an unfilled void. The recess 42 may be formed by various removal techniques such as etching and sawing. In embodiments in which each of the at least one light-segregation element 20 includes a protrusion 44, the protrusion 44 may include light-reflecting material or a light-absorbing material that extends above the monolithic substrate 36 on the primary light-extraction face 12. At least one lumiphoric material 22 is arranged between different LEDs of the plurality of LEDs 16 and is registered with the at least one light-segregation element 20 such that the at least one lumiphoric material 22 is arranged between the at least one light-segregation element 20 and the secondary light-extraction face 14. In FIG. 1B, light $L_P$ exits from the primary light-extraction face 12 and light $L_S$ exits from the secondary light-extraction face 14.

In certain embodiments, one or more LEDs may be supported and electrically connected to a light-transmissive submount. The light-transmissive submount is supported on a support element that may include a power supply, a driver, or other control circuitry for the one or more LEDs. The light-transmissive submount is supported by the support element in a manner to space the one or more LEDs away from the support element. Provision of supporting the light-transmissive submount away from the support element may beneficially allow a solid-state lighting device to be configured to be a display that outputs an image that is viewable from two opposing faces, or otherwise provide a desired light output pattern while reducing the presence of control circuitry proximate to LEDs.

FIG. 2A is a perspective view of a solid-state lighting device 46 according to some embodiments. For simplicity, only one LED of the plurality of LEDs 16 is represented, but it is understood that certain embodiments may include a plurality of LEDs 16 as described with respect to FIGS. 1A and 1B. The one LED of the plurality of LEDs 16 is mounted on a light-transmissive submount 18 as previously described. Although only one submount 18 is illustrated in FIG. 2A, in certain embodiments multiple submounts each including at least one LED may be spaced apart and supported by a single support element. The light-transmissive submount 18 includes first electrical connections 48 that extend across the light-transmissive submount 18 away from the one LED of the plurality of LEDs 16. The first electrical connections 48 may include any number of electrically conductive materials including electrical traces or patterned metal and wires. The solid-state lighting device 46 includes a support element 50 configured to support the light-transmissive submount 18. The first electrical connections 48 of the light-transmissive submount 18 are electrically connected to corresponding second electrical connections 52 on the support element 50. Additionally, the support element 50 may include circuitry 54 (e.g., a power supply, a driver, or other control circuitry for the one of the plurality of LEDs 16) and contact pads 56 configured to receive external power. Notably, the light-transmissive submount 18 is supported by the support element 50 in a manner to space the one LED of the plurality of LEDs 16 away from the support element 50 and circuitry 54. Accordingly, any absorption of light $L_P$ exiting from the primary light-extraction face 12 and light $L_S$ exiting from the secondary light-extraction face 14 by the support element 50 and circuitry 54 may be reduced. In some embodiments that include a plurality of LEDs 16, the solid-state lighting device 46 may be configured to be a display that outputs an image that is viewable from two opposing faces, such as the primary light-extraction face 12 and the secondary light-extraction face 14.

FIG. 2B is a plan view of the backside 58 of a representative one LED of the plurality of LEDs 16 illustrating the first contact 24 and the second contact 26. As previously described, the first contact 24 and the second contact 26 may be configured to be light transmissive. For example, the material and thickness of the first contact 24 and the second contact 26 may be selected to allow passage of at least some LED emissions. In other embodiments, the first contact 24 and the second contact 26 may be configured to occupy an area as small as possible while still maintaining an electrical connection. Accordingly, more light is able to pass between the first contact 24 and the second contact 26 of one LED of the plurality of LEDs 16. FIG. 2C is a plan view of the light-transmissive submount 18 illustrating the corresponding first mounting pad 28 and the second mounting pad 30 and the first electrical connections 48. Notably, the first electrical connections 48 are configured to occupy a relatively small surface area on the light-transmissive submount 18 in order to reduce any light loss associated with the first electrical connections 48. In some embodiments, the first electrical connections 48 may include a wider portion 60 to facilitate an easier electrical connection with the corresponding second electrical connections 52 of the support element 50.

In certain embodiments, a solid-state lighting device includes one or more LEDs mounted on and electrically connected to a light-transmissive submount, with the light-transmissive submount being supported on a support element in a manner to space the one or more LEDs away from the support element. The device further includes a light-transmissive cover. In certain embodiments, the solid-state lighting device may be used as a suspended lighting fixture that outputs light in two opposing directions.

Figure 3B:
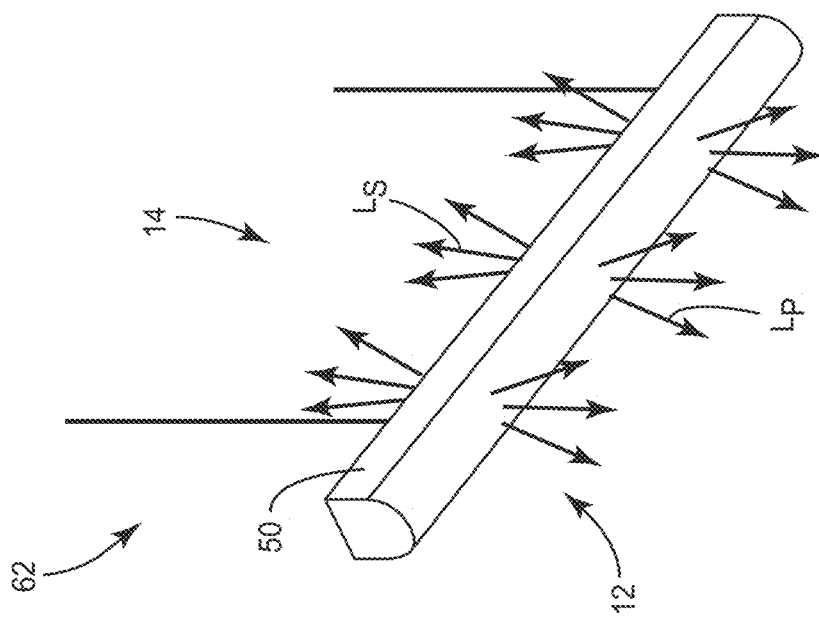
FIG. 3B is a lower perspective view of the lighting fixture of FIG. 3A.
Figure 3A:
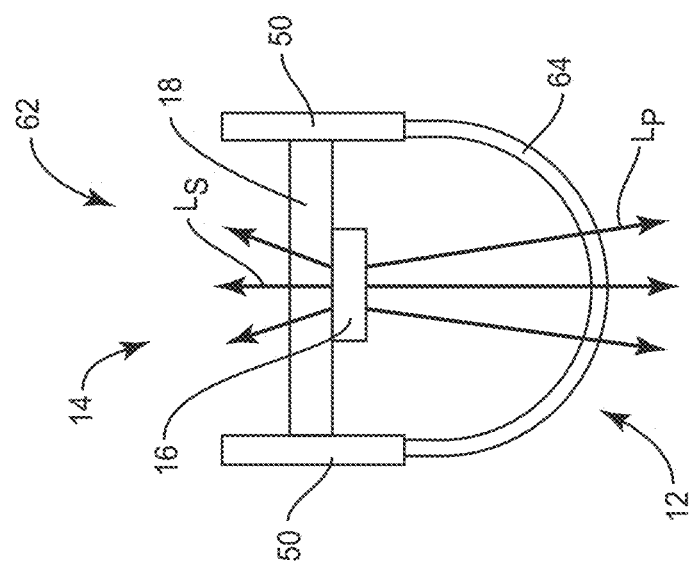
FIG. 3A is a cross-sectional view of a solid-state lighting device arranged in or as a lighting fixture configured to emit light in opposing directions according to one embodiment.

FIG. 3A is a cross-sectional view of a solid-state lighting device 62 arranged in or as a lighting fixture according to some embodiments. The solid-state lighting device 62 includes one or more LEDs 16, a light-transmissive submount 18, and a support element 50 as previously described. The solid-state lighting device 62 further includes a light-transmissive cover 64. In some embodiments, the light-transmissive cover 64 is clear or transparent, and in other embodiments, the light-transmissive cover 64 is configured as a light diffuser. In some embodiments, the light-transmissive cover 64 includes light-altering features such as one or more of: texturing or patterning on internal and/or external surfaces, or diffuser particles and/or lumiphoric particles embedded within the light-transmissive cover 64 or in additional layers or films on the light-transmissive cover 64. In some embodiments, light-altering features may be uniformly distributed across the light-transmissive cover 64, while in other embodiments, the light-altering features may be non-uniformly distributed across the light-transmissive cover 64 to provide different light distributions. As illustrated, the solid-state lighting device 62 is configured to allow light $L_P$ to exit from a primary light-extraction face 12 and to allow light $L_S$ to exit from a secondary light-extraction face 14. FIG. 3B is a lower perspective view of the solid-state lighting device 62 of FIG. 3A. As illustrated, the solid-state lighting device 62 may be particularly suited as a suspended lighting fixture that outputs light in two opposing directions where light $L_P$ exiting from the primary light-extraction face 12 provides general illumination to the space below the solid-state lighting device 62 and light $L_S$ exiting from the secondary light-extraction face 14 provides secondary illumination of a ceiling (not shown) from which the solid-state lighting device 62 is suspended. In this perspective view, the support element 50 and the light-transmissive cover 64 are also visible.

In certain embodiments, a multi-LED chip includes a plurality of LEDs on a monolithic substrate, such as a two-dimensional array of multiple (e.g., one hundred or more) flip chips. An active area of each LED of the plurality of LEDs is spaced apart from the active area of an adjacent LED by a gap that may include one or more light segregation elements. The plurality of LEDs may be individually addressable and may further be mounted on a light-transmissive submount. Mirrors typically present near a mounting face of each LED may be omitted. Provision of mounting a plurality of individually addressable LEDs on a light-transmissive submount, with omission of mirror or reflector materials proximate to LED mounting faces, enables the array of LEDs to serve as a display that is visible from both a first image-forming face and the second image-forming face.

Figure 4B:
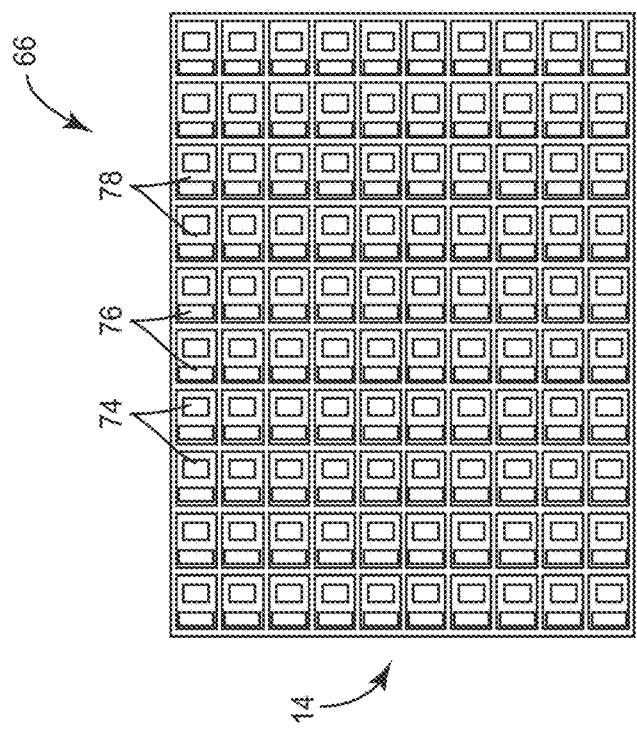
FIG. 4B is an elevation view of a rear face of the multi-LED chip of FIG. 4A.
Figure 4A:
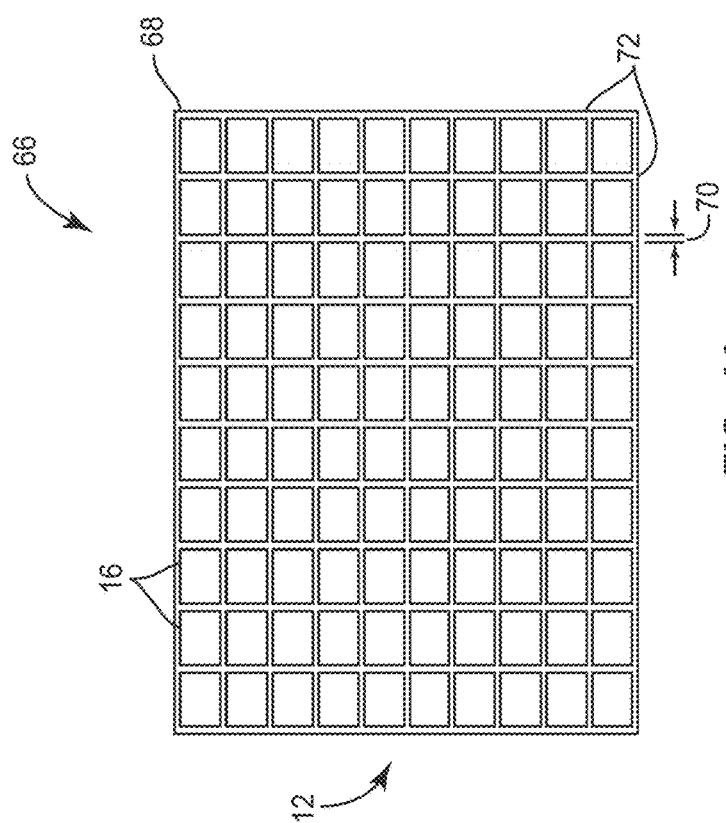
FIG. 4A is an elevation view of a front face of a multi-LED chip including multiple LEDs on a light-transmissive monolithic substrate according to one embodiment.

FIG. 4A is an elevation view of the primary light-extraction face 12, or topside, of a multi-LED chip 66 including a plurality of LEDs 16 on a monolithic substrate 68. In this example, the plurality of LEDs 16 includes a two-dimensional array of one hundred flip chips; however, it is understood that other LED configurations and other quantities of LEDs may be provided. The active area of each LED of the plurality of LEDs 16 is spaced apart from the active area of an adjacent LED of the plurality of LEDs 16 by a gap 70. The gap 70 may include one or more of the at least one light-segregation elements 20 as previously described. A central portion of each gap 70 embodies a street 72 representing a boundary between adjacent LEDs of the plurality of LEDs 16 across the multi-LED chip 66. FIG. 4B is an elevation view illustration of the secondary light-extraction face 14, or backside, of a multi-LED chip 66. Each LED of the plurality of LEDs 16 includes a cathode 74 and an anode 76 arranged along a lower surface 78. The exposed cathodes 74 and anodes 76 permit separate electrical connections to be such that each LED of the plurality of LEDs 16 may be individually addressable and independently controlled. If it were desired to separate each LED of the plurality of LEDs 16 from one another, then a conventional method to do so would be to utilize a mechanical saw to cut through the streets 72. Each LED of the plurality of LEDs 16 is arranged to emit light through the primary light-extraction face 12 (FIG. 4A) and the secondary light-extraction face 14 (FIG. 4B).

Figure 4D:
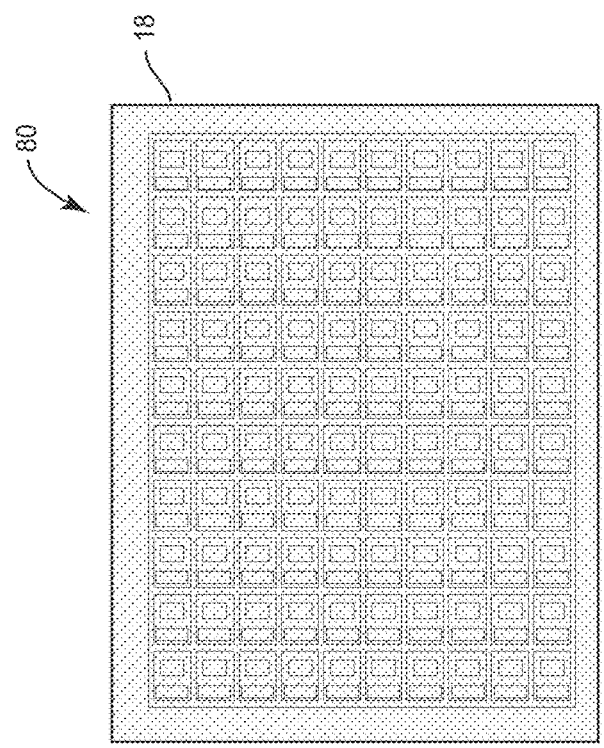
FIG. 4D is an elevation view of a rear face of the solid-state display device of FIG. 4C.
Figure 4C:
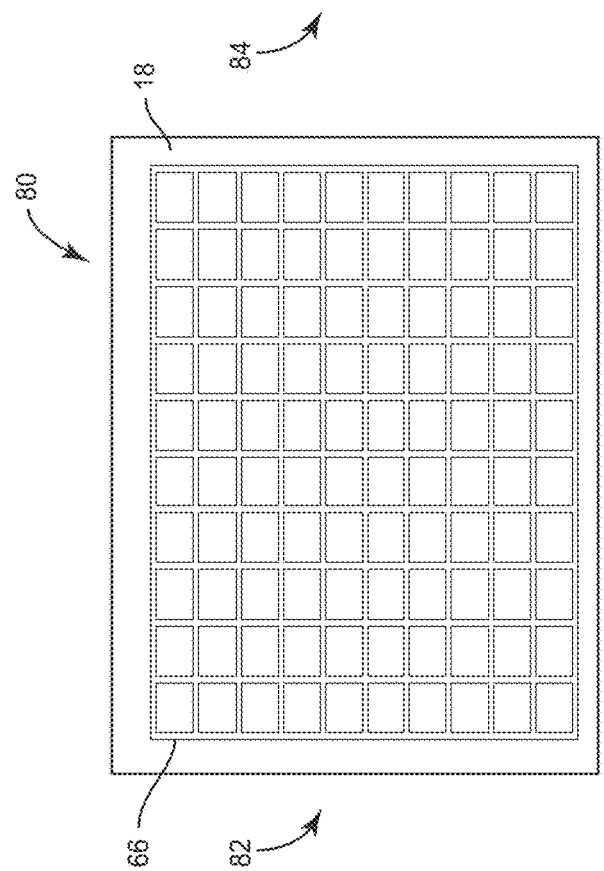
FIG. 4C is an elevation view of a front face of a solid-state display device incorporating the multi-LED chip of FIGS. 4A and 4B.

FIG. 4C is an elevation view illustration of a solid-state display device 80 in which the multi-LED chip 66 is mounted on a light-transmissive submount 18. As previously described, the light-transmissive submount 18 may include any number of light-transmissive materials, including but not limited to glass, sapphire, silicon carbide, polymers, dielectrics, and combinations thereof. The light-transmissive submount 18 may be rigid in some embodiments and flexible in other embodiments. FIG. 4D is an elevation view illustration of the solid-state display device 80 from the backside. Notably, each LED of the plurality of LEDs 16 is visible through the light-transmissive submount 18. Accordingly, the solid-state display device 80 includes a first image-forming face 82 (shown in FIG. 4C) and a second image-forming face 84 (shown in FIG. 4D) that generally opposes the first image-forming face 82. The plurality of LEDs 16 is arranged between the first image-forming face 82 and the second image-forming face 84, and both the first image-forming face 82 and the second image-forming face 84 are externally visible. At least one light-segregation element 20 as previously described may be positioned between different LEDs of the plurality of LEDs 16. In some embodiments, the first image-forming face 82 and the second image-forming face 84 may display the same image (one embodying the reverse of the other). In other embodiments, some LEDs of the plurality of LEDs 16 may be configured to preferentially provide light to the first image-forming face 82, while other LEDs of the plurality of LEDs 16 may be configured to preferentially provide light to the second image-forming face 84. Thus, in certain embodiments, the first image-forming face 82 and the second image-forming face 84 may display different images.

Figure 4F:
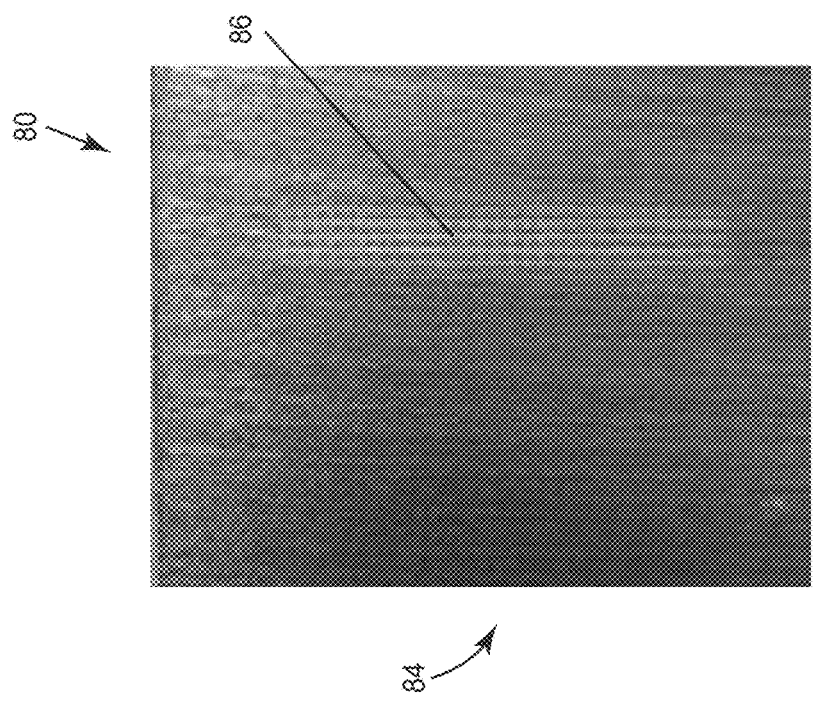
FIG. 4F is an elevation view photograph of a rear face of the solid-state display device of FIG. 4E.
Figure 4E:
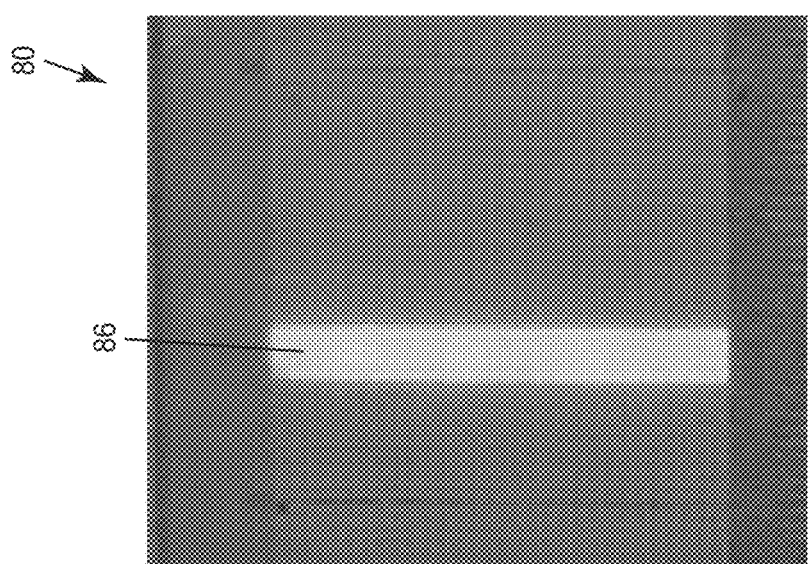
FIG. 4E is an elevation view photograph of a front face of a representative solid-state display device incorporating a multi-LED chip according to one embodiment.

FIG. 4E is an elevation view photograph of the first image-forming face 82 of a representative solid-state display device 80, and FIG. 4F is an elevation view photograph of the second image-forming face 84 of the representative solid-state display device 80. An image 86 is formed when a subgroup of LEDs is individually illuminated, and the image 86 is viewable from both the first image-forming face 82 and the second image-forming face 84.

In certain embodiments described herein, solid-state lighting devices include at least one LED with a first light-extraction face and a second light-extraction face that generally opposes the first light-extraction face. In some embodiments, the first light-extraction face and second light-extraction face include opposing sidewalls of an LED. In such embodiments, mirrors internal to the LED may be utilized to direct omnidirectional light from the active region toward the first light-extraction face and the second light-extraction face. The LEDs may be encapsulated by a continuous encapsulant material that may include light-affecting materials. Provision of at least one LED with light-extraction faces on opposing sidewalls within a continuous encapsulant allows light to be scattered and converted in the continuous encapsulant material, thereby providing a wider and softer emission pattern with reduced glare for the solid-state lighting device.

FIG. 5 is a cross-sectional view of a solid-state lighting device 88 according to some embodiments. The solid-state lighting device 88 includes a plurality of LEDs 16, such as LED chips, with each LED of the plurality of LEDs 16 including a first face 90 and a second face 92. As previously described, LEDs generally include one or more active layers of semiconductor material (or an active region) arranged between the first face 90 and the second face 92. The plurality of LEDs may have a peak emissive wavelength light of any suitable color, such as but not limited to blue, green, or red. For example, a blue LED may include a peak wavelength in a range of 430 nm to 480 nm, a green LED may include a peak wavelength in a range of 500 nm to 570 nm, and a red LED may include a peak wavelength in a range of 600 nm to 650 nm. At least one LED of the plurality of LEDs 16 includes a first mirror 94 arranged on the first face 90 and a second mirror 96 arranged on the second face 92. Accordingly, omnidirectional light emitted by the active region is directed toward a first light-extraction face 98 and a second light-extraction face 100. In some embodiments, the first light-extraction face 98 and the second light-extraction face 100 are sidewalls of each LED of the plurality of LEDs 16. The first mirror 94 and the second mirror 96 may be a reflector or a reflective surface including single or multiple layers. Some multi-layer mirrors include a metal reflector layer and a dielectric reflector layer, wherein the dielectric reflector layer is arranged between the metal reflector layer and the plurality of semiconductor layers. For single or multi-layer mirrors, some light may be absorbed by the mirror due to reflectivity values of less than 100% for various reflector surfaces. Some single or multi-layer mirrors have reflectivity values above 90%, while others have reflectivity values above 95%, and still others have reflectivity values above 98%. A continuous encapsulant material 102 encapsulates the plurality of LEDs 16 and may be any transmissive material, such as silicone or glass. In some embodiments, the continuous encapsulant material 102 includes one or more light-affecting materials such as lumiphoric materials or scattering materials. Lumiphoric materials may include yellow phosphors, green phosphors, cyan phosphors, red phosphors, quantum dots, and combinations thereof. Light scattering materials may include the lumiphoric materials listed above and/or non-lumiphoric particles such as titanium dioxide in powdered or particulate form. In some embodiments, at least one LED of the plurality of LEDs 16 includes a blue LED with the first mirror 94 and the second mirror 96, and the continuous encapsulant material 102 includes a lumiphoric material that converts at least a portion of blue emissions from the blue LED to a longer wavelength. The light-affecting material may be uniformly distributed within the continuous encapsulant material 102 in some embodiments. In other embodiments, light-affecting material may be non-uniformly distributed within the continuous encapsulant material 102. The first mirror 94 and the second mirror 96 direct light from the blue LED laterally into the continuous encapsulant material 102, and thereby give the blue light a longer path length to travel through the continuous encapsulant material 102. Accordingly, more blue light may be scattered and converted in the continuous encapsulant material 102, resulting in a wider and softer emission pattern with reduced glare for the solid-state lighting device 88. Without the first mirror 94 and the second mirror 96, emissions of the blue LED may appear as a bright spot within the continuous encapsulant material 102. In some embodiments, each LED of the plurality of LEDs 16 may be spaced apart from at least one other LED of the plurality of LEDs 16 by a distance D that is greater than a width W of the individual LED. In some embodiments, each LED of the plurality of LEDs 16 may include a blue LED with a first mirror 94 and a second mirror 96.

FIG. 6 is a cross-sectional view of a solid-state lighting device 104 according to an embodiment including multiple LEDs of different colors. The solid-state lighting device 104 includes a plurality of LEDs 16 and a continuous encapsulant material 102 as described for FIG. 5. In FIG. 6, at least one LED of the plurality of LEDs 16 is a blue LED (labeled B) with the first mirror 94 and the second mirror 96 as previously described. At least another LED of the plurality of LEDs 16 is an LED of a different color, such as green (labeled G) and red (labeled R). Accordingly, emissions of the blue LED may be transmitted laterally into the continuous encapsulant material 102 that surrounds the plurality of LEDs 16, with such emissions being scattered and converted by lumiphoric material in the encapsulant material 102. Since the same encapsulant material 102 surrounds the LEDs 16 of multiple colors, and emissions of each LED 16 are transmitted through the encapsulant material 102, emissions of multiple colored LEDs and lumiphoric materials are uniformly mixed as aggregate emissions of the solid state lighting device 104.

FIG. 7 is a cross-sectional view of a solid-state lighting device 106 similar to that in FIG. 6, but with the first mirror 94 and the second mirror 96 provided on all LEDs of the plurality of LEDs 16. Accordingly, light emitted by the red, green, blue LEDs 16 as well as the lumiphoric materials may be mixed further into a broad emission pattern with reduced glare. Additionally, since all LED emissions are initially directed laterally within the continuous encapsulant material 102, the solid-state lighting device 106 may have an even softer appearance due to the absence of visible bright spots associated with the LEDs 16.

Figure 8:
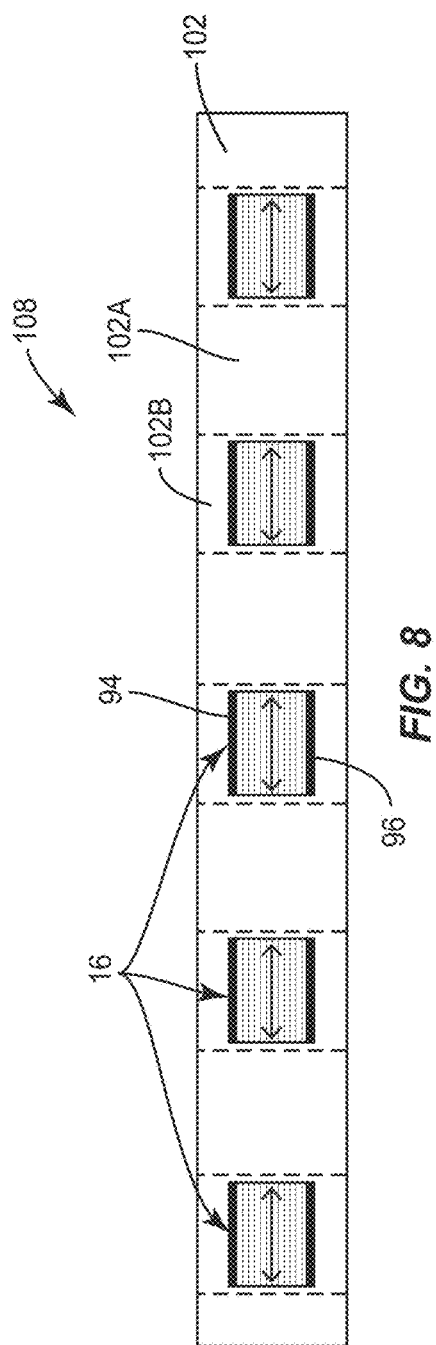
FIG. 8 is a cross-sectional view of a solid-state lighting device including multiple LED chips in a non-uniformly distributed encapsulant material, with each LED chip having reflective materials arranged proximate to first and second faces thereof to direct light emissions laterally, and with the encapsulant material including a higher density of light affecting material arranged between LED chips, according to one embodiment.

FIG. 8 is a cross-sectional view of a solid-state lighting device 108 similar to the solid-state lighting devices 88, 104, 106 shown in FIGS. 5, 6, and 7, respectively. The solid-state lighting device 108 includes a plurality of LEDs 16, each including an active region arranged between a first mirror 94 arranged on a first face and a second mirror 96 arranged on a second face. An encapsulant material 102 surrounds the plurality of LEDs 16. In FIG. 8 the light-affecting material is non-uniformly distributed within the continuous encapsulant material 102, including alternating first and second encapsulant regions 102A, 102B having higher and lower densities of light-affecting material, respectively. As shown, first encapsulant regions 102A having higher densities of light-affecting material are arranged between LEDs of the plurality of LEDs 16, and second encapsulant regions 102B having lower densities of light-affecting material are arranged proximate to LEDs 16. As previously described, the first mirror 94 and the second mirror 96 arranged on each LED 16 are configured to direct light emitted from active regions of the LEDs 16 laterally within the continuous encapsulant material 102. Arranging a highest density of light-affecting material between LEDs of the plurality of LEDs 16 provides a higher opportunity for light to interact with the light-affecting material. In some embodiments, the portion of the continuous encapsulant material 102 not arranged between LEDs of the plurality of LEDs 16 (above and below each LED in FIG. 8) includes a lower density of light-affecting material than a density of light-affecting material provided between LEDs of the plurality of LEDs 16. In other embodiments, the portion of the continuous encapsulant material 102 not arranged between LEDs of the plurality of LEDs 16 is devoid of light-affecting material.

Figure 9:
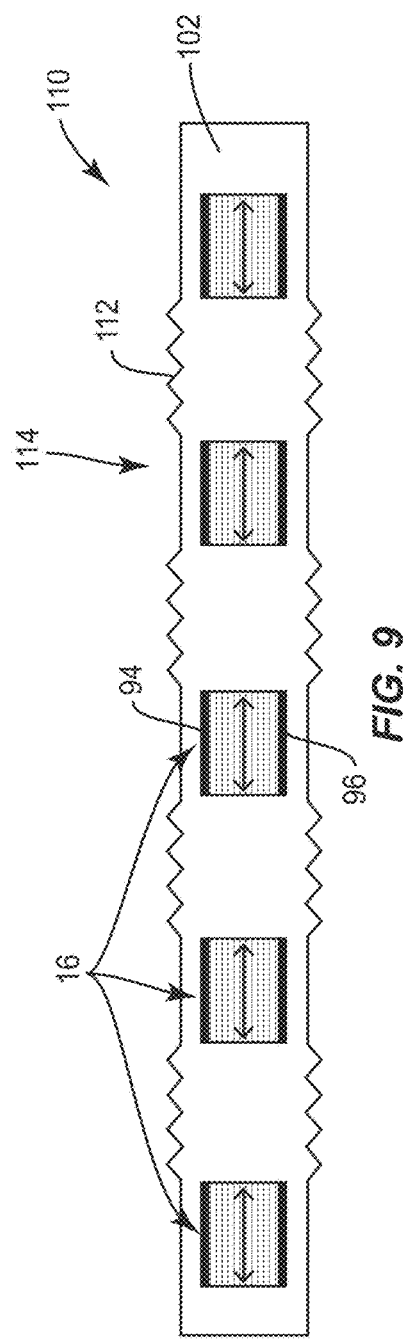
FIG. 9 is a cross-sectional view of a solid-state lighting device including multiple LED chips in a non-uniformly distributed encapsulant material, with each LED chip having reflective materials arranged proximate to first and second faces thereof to direct light emissions laterally, and with light-extraction elements arranged on external surfaces of the lighting device between LED chips, according to one embodiment.

FIG. 9 is a cross-sectional view of a solid-state lighting device 110 similar to the solid-state lighting devices 88, 104, 106 shown in FIGS. 5, 6, and 7, respectively, with one or more light-extraction elements 112 arranged on external surfaces of the solid-state lighting device 110. The solid-state lighting device 110 includes a plurality of LEDs 16, such as LED chips, and at least one of the LEDs 16 includes a first mirror 94 and a second mirror 96 as previously described. In FIG. 9, the continuous encapsulant material 102 includes light-extraction elements 112 proximate to a light-extraction surface 114 of the continuous encapsulant material 102. The light-extraction elements 112 increase the probability that light of varying angles of incidence with the light-extraction surface 114 may escape the continuous encapsulant material 102. In some embodiments, the light-extraction elements 112 re-direct or scatter light randomly, such that visibility of dark spots associated with the laterally emitting LEDs 116 may be reduced. In some embodiments, the light-extraction elements 112 re-direct or scatter light in a preferential direction. Each light-extraction element 112 may include at least one of a textured surface, a patterned surface, a lens shape, or any other non-linear surface. In some embodiments, each light-extraction element 112 may embody a surface of the continuous encapsulant material 102. In other embodiments, the light-extraction elements 112 may embody a different material arranged on a surface of the continuous encapsulant material 102. In some embodiments, at least one light-extraction element 112 is arranged between each LED of the plurality of LEDs 16, whereas in other embodiments, a light-extraction element 112 may be located across all or substantially all of the light-extraction surface 114.

Figure 10:
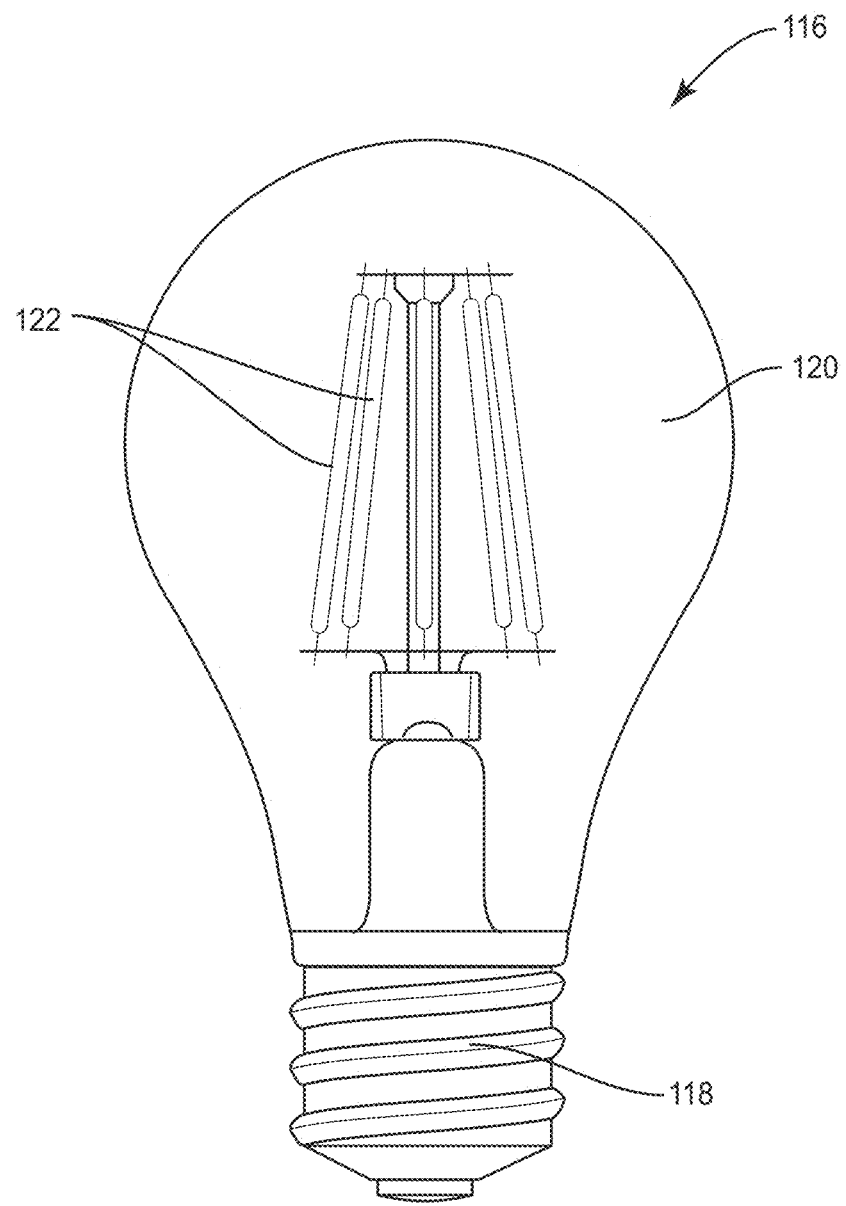
FIG. 10 is a cross-sectional view of a solid-state lighting device embodied in a light bulb including multiple LED filaments according to one embodiment.

The lighting devices described in connection to FIGS. 5-9 may be suited for use as tubular LED strips in the form of LED filaments. FIG. 10 is a cross-sectional view of a solid-state lighting device 116 embodied in a light bulb including a base 118 and an enclosure 120, with multiple LED filaments 122 (each including or embodying LED lighting devices such as shown in FIGS. 5-9) within the enclosure 120. The base 118 may include an Edison or screw base, a two-pin base, a twist and lock base, a bayonet base, a wedge base, a plug-in base, or any other kind of base with at least first and second electrical contacts. The enclosure 120 includes at least one light-transmissive surface. The enclosure 120 may include any transparent or transmissive material, such as glass and plastic, and the enclosure 120 may have any shape, such as A series, PS series, B series, C series, CA series, RP and S series, F series, Prism series, R series, MR series, BR series, G series, T series, BT series, E series, ED series, AR series, and PAR series. The LED filaments 122 are arranged within the enclosure 120 in electrical communication with first and second contacts of the base 118.

In certain embodiments described herein, a solid-state lighting device includes at least one LED mounted on a light-reflective submount in a manner such that an active region of the LED is between a mirror of the LED and the light-reflective submount. The LED may be devoid of a mirror between the active region and the light-reflective submount. A lumiphoric material may on the at least one LED and other portions of the light-reflective submount that are not covered by the at least one LED. Accordingly, at least some light may be directed toward the light-reflective submount, where it may be reflected around the at least one LED and converted by the lumiphoric material.

Figure 11:
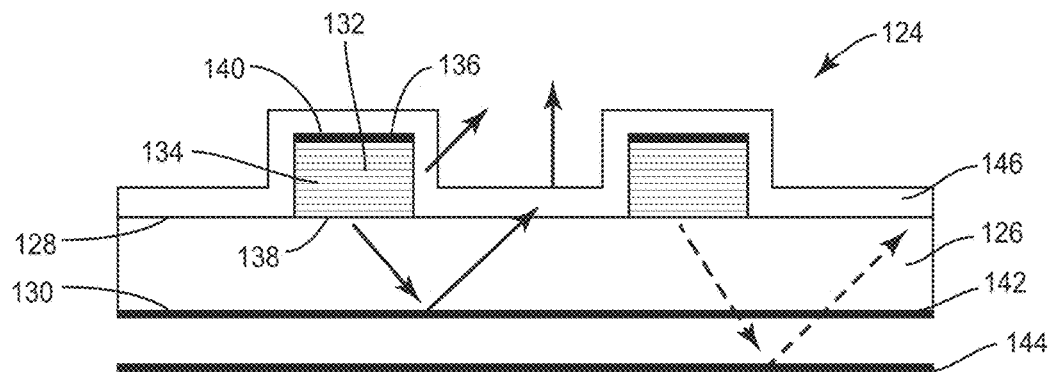
FIG. 11 is a cross-sectional view of a solid-state lighting device including multiple LED chips each having a first mirror arranged thereover and being supported by a submount, with a second mirror being spaced apart from the multiple LED chips by at least a thickness of the submount, according to one embodiment.

FIG. 11 is cross-sectional view of a solid-state lighting device 124 according to some embodiments. The solid-state lighting device 124 includes a submount 126 having a proximal face 128 and a distal face 130, with at least one LED chip 132 being supported by the proximal face 128. Each LED chip 132 includes an active region 134 between a first face 136 and an opposing second face 138. Each LED chip 132 further includes a first mirror 140, with the active region 134 being arranged between the first mirror 140 and the submount 126. The at least one LED chip 132 is devoid of any second mirror between the active region 134 and the submount 126. The submount 126 includes or has associated therewith a light-reflective surface, such as a light-reflective layer 142 that may be arranged on the distal face 130. Accordingly, at least some of the light emitted from the active region 134 toward the first face 136 is reflected by the first mirror 140 toward the second face 138, and at least some light directly emitted from the active region 134 or reflected by the first mirror 140 may pass into the light-reflective submount 126. In certain embodiments, the distal face 130 includes a light-reflective layer 142 to reflect light back toward the proximal face 128 and around the at least one LED chip 132. In other embodiments, the light-reflective layer 142 arranged on the distal face 130 may be omitted, but a reflective surface 144 that is remote or spaced apart from the submount 126 (such as on a housing of a lighting fixture) may be provided to serve substantially the same purpose. In such embodiments, the reflective surface 144 may be spaced apart from the submount 126 by air. In other embodiments, the reflective surface 144 may be spaced apart from the submount 126 with a material that has an index of refraction matched to at least one of the submount 126 and the reflective surface 144. While in other embodiments, the reflective surface 144 may be spaced apart from the submount 126 with a material that has an index of refraction intermediate the submount 126 and the reflective surface 144. In certain embodiments, the solid-state lighting device 124 may include a lumiphoric material 146 on the proximal face 128 of the submount 130. The lumiphoric material 146 may be dispersed in an encapsulant, adhesive, or other binding medium, and formed by any suitable process, such as spray coating, dipping, liquid dispensation, powder coating, or inkjet printing. The lumiphoric material 146 may be arranged on the at least one LED chip 132 and on any portion of the proximal face 128 that is not covered by the at least one LED chip 132. Accordingly, at least some light reflected by the light-reflective layer 142 toward the proximal face 128 and around the at least one LED chip 132 may be converted by the lumiphoric material 146. In certain embodiments such as shown in FIG. 11, the at least one LED chip 132 includes a plurality of LED chips. To increase the amount of light that may exit the solid-state lighting device 124 between the plurality of LED chips, each LED chip may be spaced apart from at least one other adjacent LED chip by a distance that is greater than a width of the at least one LED chip 132.

Figure 12:
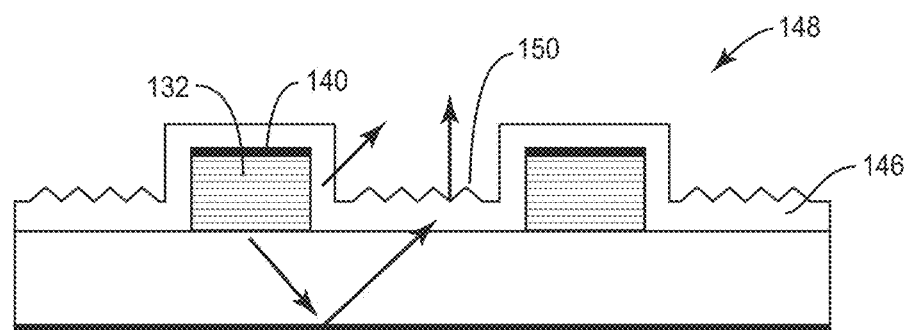
FIG. 12 is a cross-sectional view of a solid-state lighting device similar to the device of FIG. 11, with addition of light extraction elements along an outer surface between adjacent LED chips according to one embodiment.

FIG. 12 is cross-sectional view of a solid-state lighting device 148 according to some embodiments. The solid-state lighting device 148 is similar to the solid-state lighting device 124 of FIG. 11, with addition of at least one light-extraction element 150 along or proximate to a surface of the solid-state lighting device 148. The at least one light-extraction element 150 may include at least one of a textured surface, a patterned surface, a lens shape, or any other non-linear surface. In some embodiments, the at least one light-extraction element 150 may embody a surface of the lumiphoric material 146, whereas in other embodiments, the at least one light-extraction element 150 may embody a different material arranged on a surface of the lumiphoric material 146. In certain embodiments, the at least one light-extraction element 150 is between different LED chips 132, whereas in other embodiments, the at least one light-extraction element 150 may be located across an entirety, or substantially an entirety, of the lumiphoric material 146. The at least one light-extraction element 150 increases the probability that light of varying angles of incidence may escape the lumiphoric material 146. In certain embodiments, the at least one light-extraction element 150 re-directs or scatters light randomly, whereby visibility of dark spots associated with the at least one LED chip 132 and the first mirror 140 may be reduced.

Figure 13:
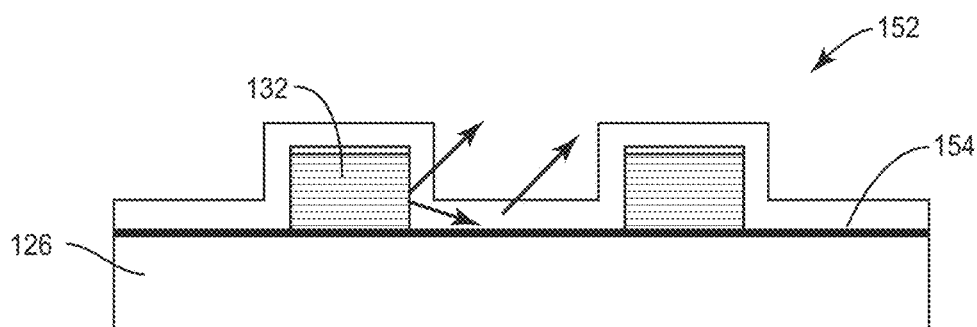
FIG. 13 is a cross-sectional view of a solid-state lighting device including multiple LED chips each having a first mirror arranged thereover and being supported by a submount having a second mirror arranged proximate to the LED chips, according to one embodiment.

FIG. 13 is cross-sectional view of a solid-state lighting device 152 according to some embodiments. The solid-state lighting device 152 is similar to the solid-state lighting device 124 of FIG. 11, with modifications to eliminate a reflective material overlying the at least one LED chip, and to provide a reflective material 154 over a proximal face 128 of the submount 126. The light-reflective material 154 is configured to reflect and redirect light emitted by the at least one LED chip 132, from a direction toward the submount 126 to one or more other directions around the at least one LED chip 132.

Figure 14:
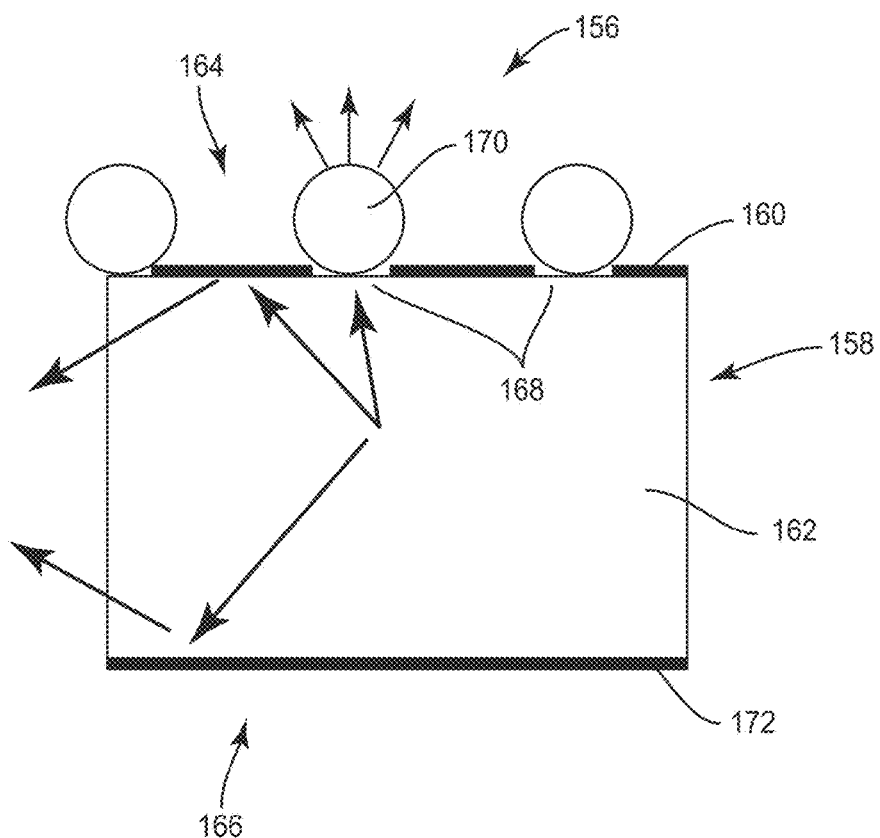
FIG. 14 is a cross-sectional view of a solid-state lighting device including a LED chip arranged between first and second mirrors, and with phosphor material arranged in openings defined in the first mirrors, according to one embodiment

FIG. 14 is a cross-sectional view of a solid-state lighting device 156 according to some embodiments. The solid-state lighting device 156 includes an LED chip 158 having an active region 162 between a first face 164 and an opposing second face 166. A first mirror 160 is arranged on the first face 164 and includes one or more openings 168. The one or more openings 168 allow at least one path for some light emitted by the active region 162 to pass through the first face 164. A lumiphoric material 170 is arranged within the one or more openings 168 for converting a portion of light transmitted through the one or more openings 168. The at least one opening 168 serves to control the amount of lumiphoric material 170 that receives light from the LED chip 158. In some embodiments, the lumiphoric material 170 may include a phosphor material with large particle sizes for improved conversion efficiency, such as a median particle size d50 of greater than 10 µm. In other embodiments, the median particle size d50 is 20 µm, 30 µm, or higher. In some embodiments, the one or more openings 168 are each configured to accommodate a single phosphor particle, while in other embodiments, the one or more openings 168 are each configured to accommodate multiple phosphor particles. The lumiphoric material 170 may include a mixture of different phosphor materials having different median particle sizes. In some embodiments, the one or more openings 168 may include the mixture of different phosphor materials having different median particle sizes. In other embodiments, the one or more openings 168 may be configured to preferentially allow more phosphor material of a particular particle size of the mixture within the opening. For example, the lumiphoric material 170 may include a mixture of yellow and red phosphors and the one or more openings 168 may be configured to preferentially allow more of the red phosphors within the one or more openings 168 while the mixture of yellow and red phosphors is present above the one or more openings 168. Accordingly, one or more phosphor particles may be in contact with both the LED chip 158 and the first mirror 160, and the first mirror 160 provides a thermal path to dissipate heat from the one or more phosphor particles. The LED chip 158 may further include a second mirror 172 on the second face 166 to reflect and redirect light from the active region 162. In some embodiments, a first portion of light from the active region 162 escapes laterally from the LED chip 158 and another portion of light from the active region 162 escapes through the one or more openings 168. In other embodiments, a light reflective material (such as titanium dioxide suspended in a binder) may be arranged around the LED chip 158 to prevent lateral escape of light, such that a majority of the light escapes through the at least one opening 168. While not illustrated, it is understood the second mirror 172 may be configured with one or more openings that include a lumiphoric material, similar to the configuration of the first mirror 160. It is to be understood that features of the solid-state lighting device 156 of FIG. 14 may be applied to any of the figures and embodiments previously described herein.

In certain embodiments described herein, a solid-state lighting device includes LEDs mounted on opposing faces of a light-transmissive submount, with an outermost face of each LED being covered with a mirror, and with an active regions of each LED being between a mirror and the light-reflective submount. Each LED may be devoid of a mirror between the active region and the light-transmissive submount. A lumiphoric material may be arranged on or over each LED and other portions of the light-transmissive submount not covered by LEDs. Accordingly, at least some light may be directed through the light-transmissive submount and laterally around each LED to reduce dark spots that would otherwise be pronounced due to presence of mirrors on outermost faces of the LEDs.

Figure 15:
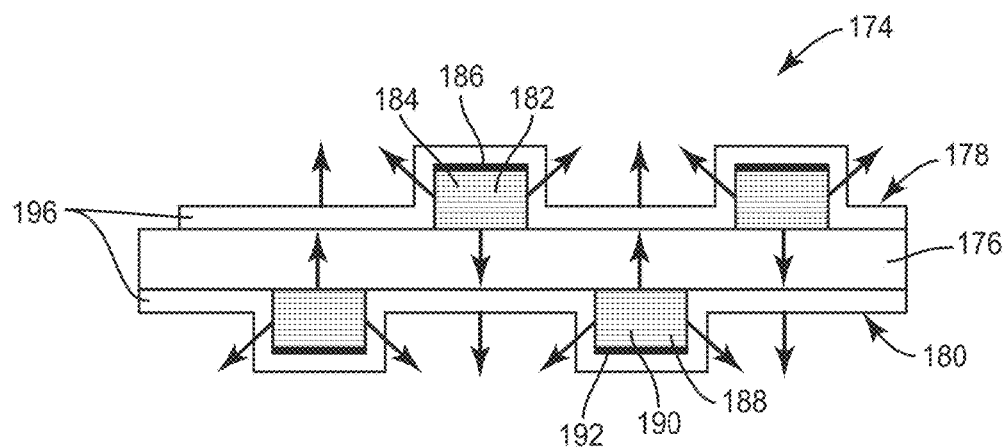
FIG. 15 is a cross-sectional view of a solid-state lighting device including multiple LEDs arranged in an alternating manner on first and second faces of a light-transmissive submount, with an outermost face of each LED being covered with a mirror, and with each LED further being covered by an encapsulant material, according to one embodiment

FIG. 15 is a cross-sectional view of a solid-state lighting device 174 including multiple LED chips 182, 190 arranged in an alternating manner on first and second faces of a light-transmissive submount 176, according to some embodiments. The light-transmissive submount 176 includes a proximal face 178 and a distal face 180. A first LED chip 182 supported by the proximal face 178 includes a first active region 184 and a first mirror 186, such that the first active region 184 is arranged between the first mirror 186 and the light-transmissive submount 176. A second LED chip 188 is supported by the distal face 180 and includes a second active region 190 and a second mirror 192, such that the second active region 190 is arranged between the second mirror 192 and the light-transmissive submount 176. In operation, some light emitted from the first active region 184 may exit laterally from the first LED chip 182 and additional light emitted from the first active region 184 may pass through and exit the light-transmissive submount 176 at the distal face 180 adjacent to the second LED chip 188. In a similar manner, some light from the second LED chip 188 may exit the light-transmissive submount 176 at the proximal face 178 adjacent to the first LED chip 182. Accordingly, any dark spots associated with the first LED chip 182 and first mirror 186 or the second LED chip 188 and the second mirror 192 may be reduced. At least one lumiphoric material 194 may be included on the proximal face 178 and the distal face 180. In some embodiments, the first LED chip 182 includes a plurality of first LED chips spaced apart on the proximal face 178 and the second LED chip 188 includes a plurality of second LED chips spaced apart on the distal face 180. The plurality of second LED chips may be positioned on the distal face 180 offset from the plurality of first LED chips on the proximal face 178 in order to increase the amount of light emitted between the plurality of first LED chips. In some embodiments, the solid-state lighting device 174 may be particularly suited as an LED filament for use in a light bulb such as shown in FIG. 10.

Those skilled in the art will recognize improvements and modifications to the preferred embodiments of the present disclosure. All such improvements and modifications are considered within the scope of the concepts disclosed herein and the claims that follow.

What is claimed is:

1. A solid-state lighting device comprising:
 a primary light-extraction face and a secondary light-extraction face that generally opposes the primary light-extraction face;
 a plurality of light-emitting diodes (LEDs) supported by a light-transmissive submount;
 at least one light-segregation element positioned between different LEDs of the plurality of LEDs proximate to the primary light-extraction face; and
 at least one lumiphoric material arranged between different LEDs of the plurality of LEDs registered with the at least one light-segregation element, wherein the at least one lumiphoric material is arranged between the at least one light-segregation element and the secondary light-extraction face.

2. The solid-state lighting device of claim 1 wherein light emitted by the plurality of LEDs is extracted from both the primary light-extraction face and the secondary light-extraction face.

3. The solid-state lighting device of claim 1 wherein the plurality of LEDs comprises a plurality of discrete LED chips.

4. The solid-state lighting device of claim 1 wherein the at least one light-segregation element comprises a reflective material.

5. The solid-state lighting device of claim 1 wherein the plurality of LEDs comprises a plurality of active regions arranged on or over a monolithic substrate.

6. The solid-state lighting device of claim 1 wherein the at least one light-segregation element comprises an unfilled void.

7. The solid-state lighting device of claim 1 wherein each LED of the plurality of LEDs is independently controllable.

8. The solid-state lighting device of claim 1 further comprising a support element configured to support the light-transmissive submount.

9. The solid-state lighting device of claim 8 wherein the support element is configured to be a display that outputs an image that is viewable from two opposing sides.

10. The solid-state lighting device of claim 8 wherein the support element is configured to be a suspended lighting fixture that outputs light in two opposing directions.

* * * * *

UNITED STATES PATENT AND TRADEMARK OFFICE
CERTIFICATE OF CORRECTION

PATENT NO. : 10,529,773 B2
APPLICATION NO. : 15/896805
DATED : January 7, 2020
INVENTOR(S) : Peter Scott Andrews and Christopher P. Hussell Page 1 of 1

It is certified that error appears in the above-identified patent and that said Letters Patent is hereby corrected as shown below:

In the Specification

In Column 19, Lines 1 and 5, replace "1028" with --102B--.

Signed and Sealed this
Third Day of March, 2020

Andrei Iancu
*Director of the United States Patent and Trademark Office*